(12) United States Patent
Xu et al.

(10) Patent No.: US 11,201,288 B2
(45) Date of Patent: Dec. 14, 2021

(54) GENERALIZED ORGANIC VAPOR JET DEPOSITOR CAPABLE OF HIGH RESOLUTION PRINTING AND METHOD FOR OVJP PRINTING

(71) Applicant: Universal Display Corporation, Ewing, NJ (US)

(72) Inventors: Xin Xu, West Windsor, NJ (US); Gregory McGraw, Yardley, PA (US); William E. Quinn, Whitehouse Station, NJ (US)

(73) Assignee: Universal Display Corporation, Ewing, NJ (US)

( * ) Notice: Subject to any disclaimer, the term of this patent is extended or adjusted under 35 U.S.C. 154(b) by 379 days.

(21) Appl. No.: 15/981,482

(22) Filed: May 16, 2018

(65) Prior Publication Data
US 2018/0342675 A1    Nov. 29, 2018

Related U.S. Application Data

(60) Provisional application No. 62/511,730, filed on May 26, 2017.

(51) Int. Cl.
*H01L 51/00* (2006.01)
*B41J 2/14* (2006.01)
(Continued)

(52) U.S. Cl.
CPC ........ *H01L 51/001* (2013.01); *B05B 12/18* (2018.02); *B41J 2/04* (2013.01); *B41J 2/045* (2013.01); *B41J 2/1433* (2013.01); *C23C 14/04* (2013.01); *C23C 14/12* (2013.01); *C23C 14/228* (2013.01); *C23C 16/45563* (2013.01); *H01L 27/3209* (2013.01); *H01L 51/0035* (2013.01); *H01L 51/5016* (2013.01); *H01L 51/5234* (2013.01); *H05B 33/10* (2013.01); *H05B 33/12* (2013.01);
(Continued)

(58) Field of Classification Search
None
See application file for complete search history.

(56) References Cited

U.S. PATENT DOCUMENTS 4,769,292 A    9/1988 Tang
5,247,190 A    9/1993 Friend
(Continued)

FOREIGN PATENT DOCUMENTS

CN    102428205 A    4/2012
CN    105316623 A    2/2016
(Continued)

OTHER PUBLICATIONS

European Extended Search Report for EP18174284.2, dated Oct. 17, 2018, 13 pages.
(Continued)

*Primary Examiner* — Joel G Horning
(74) *Attorney, Agent, or Firm* — Butzel Long

(57) ABSTRACT

OVJP depositors and techniques for using the same are provided, in which the in-substrate plane velocity of the delivery and confinement flows are both nonzero and parallel to each other across the boundary between the two. These configurations provide improved material utilization efficiency and relaxed fly height tolerances, while achieving acceptable printing resolution and feature uniformity.

18 Claims, 20 Drawing Sheets

(51) Int. Cl.
*C23C 14/22* (2006.01)
*C23C 14/12* (2006.01)
*C23C 14/04* (2006.01)
*B41J 2/04* (2006.01)
*B05B 12/18* (2018.01)
*B41J 2/045* (2006.01)
*C23C 16/455* (2006.01)
*H01L 27/32* (2006.01)
*H01L 51/50* (2006.01)
*H01L 51/52* (2006.01)
*H05B 33/10* (2006.01)
*H05B 33/12* (2006.01)

(52) U.S. Cl.
CPC ....... *B41J 2202/02* (2013.01); *H01L 51/0004* (2013.01)

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 8,944,309 | B2 | 2/2015 | Forrest |
| 2003/0230980 | A1 | 12/2003 | Forrest |
| 2004/0174116 | A1 | 9/2004 | Lu |
| 2010/0247766 | A1* | 9/2010 | Forrest ............... B41J 2/005 427/255.23 |
| 2015/0376787 | A1 | 12/2015 | McGraw |
| 2015/0380648 | A1 | 12/2015 | McGraw |
| 2016/0083845 | A1 | 3/2016 | Quinn |
| 2017/0022963 | A1 | 1/2017 | DeBenedictis |
| 2017/0229663 | A1 | 8/2017 | Jui-Yi |
| 2018/0342675 | A1 | 11/2018 | Xin |

FOREIGN PATENT DOCUMENTS

| | | |
|---|---|---|
| EP | 2960059 A2 | 12/2015 |
| EP | 3157071 A1 | 4/2017 |
| WO | 2008057394 A1 | 5/2008 |
| WO | 2010011390 A2 | 1/2010 |
| WO | 2010111387 A1 | 9/2010 |
| WO | 2018023046 | 2/2018 |

OTHER PUBLICATIONS

Baldo, "Highly efficient phosphorescent emission from organic electroluminescent devices," Nature, vol. 395, pp. 151-154, 1998.
Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Chinese Office Action for App. No. CN201810520563.1, dated Mar. 1, 2021, 10 pages.

* cited by examiner

GENERALIZED ORGANIC VAPOR JET DEPOSITOR CAPABLE OF HIGH RESOLUTION PRINTING AND METHOD FOR OVJP PRINTING

CROSS-REFERENCE TO RELATED APPLICATIONS

This application is a non-provisional and claims the benefit of U.S. Provisional Patent Application Ser. No. 62/511,730, filed May 26, 2017 the entire contents of which are incorporated herein by reference.

FIELD

The present invention relates to devices and techniques for fabricating devices using OVJP techniques, and devices fabricated using the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an OVJP depositor is provided that includes a delivery aperture in fluid communication with a source of organic material to be deposited on a substrate and a carrier gas, a first exhaust aperture disposed ahead of the delivery aperture, a second exhaust aperture disposed behind the delivery aperture, a first confinement gas aperture disposed laterally adjacent to the delivery aperture, and a second confinement gas aperture disposed laterally adjacent to the delivery aperture and opposite the first confinement gas aperture relative to the first confinement gas aperture. The delivery aperture, the first and second exhaust apertures, and the first and second confinement gas apertures may be arranged on a surface of the depositor such that, when the depositor is operated to deposit organic material on a substrate, a first flow of material from the delivery aperture to at least one of the first and second exhaust apertures is parallel to a second flow of material from at least one of the first and second confinement gas apertures. A dimension of the delivery aperture parallel to the direction of relative motion of the depositor and a substrate when the depositor is operated to deposit material on the substrate may be shorter than a distance between an edge of the delivery aperture closest to the second exhaust aperture and an edge of the second exhaust aperture farthest from the delivery aperture. The first exhaust aperture may have a width that is less than a width of the feature that is to be printed on the substrate when the depositor is operated to deposit material on the substrate. For example, the first exhaust aperture may have a width of not more than 50 µm. The exhaust apertures and/or the confinement gas apertures may be oval, circular, rectangular. The delivery aperture and/or the confinement gas apertures may have straight side walls or chamfered side walls. The depositor may have various relative geometries between the various apertures. For example, the delivery-to-exhaust spacing DE of the depositor may be not more than 400 µm. As another example, the delivery-to-confinement spacing DC of the depositor may be not more than 130 µm. The width of the first and second exhaust apertures may be greater than the width of the delivery aperture. Each of the first and second exhaust apertures may have a maximum width of not more than 500 µm. More specifically, each of the first and second exhaust apertures has a maximum width in the range of 100-500 µm.

In an embodiment, an OVJP nozzle block is provided that includes a plurality of OVJP depositors as disclosed herein. Each depositor may include separate delivery, exhaust, and confinement apertures. Alternatively or in addition, some apertures may be shared between and across multiple depositor configurations, such as where exhaust apertures are shared by multiple delivery apertures.

Embodiments of operating the depositors disclosed herein are also provided. For example, an embodiment of operating an OVJP depositor as disclosed herein includes providing a delivery gas containing an organic material to be deposited on a substrate from a delivery aperture in an OVJP depositor, providing confinement gas to a region between the OVJP depositor and the substrate via a first confinement gas aperture disposed laterally adjacent to the delivery aperture and a second confinement gas aperture disposed laterally adjacent to the delivery aperture and opposite the first confinement gas aperture relative to the first confinement gas aperture, and removing material from the region between the OVJP depositor and the substrate via a first exhaust aperture disposed ahead of the delivery aperture and a second exhaust aperture disposed behind the delivery aperture. When a depositor is operated to deposit material on a substrate, the molar flow of inert gas through the first and second exhaust apertures in total may be greater than the molar flow of inert gas through the delivery aperture.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
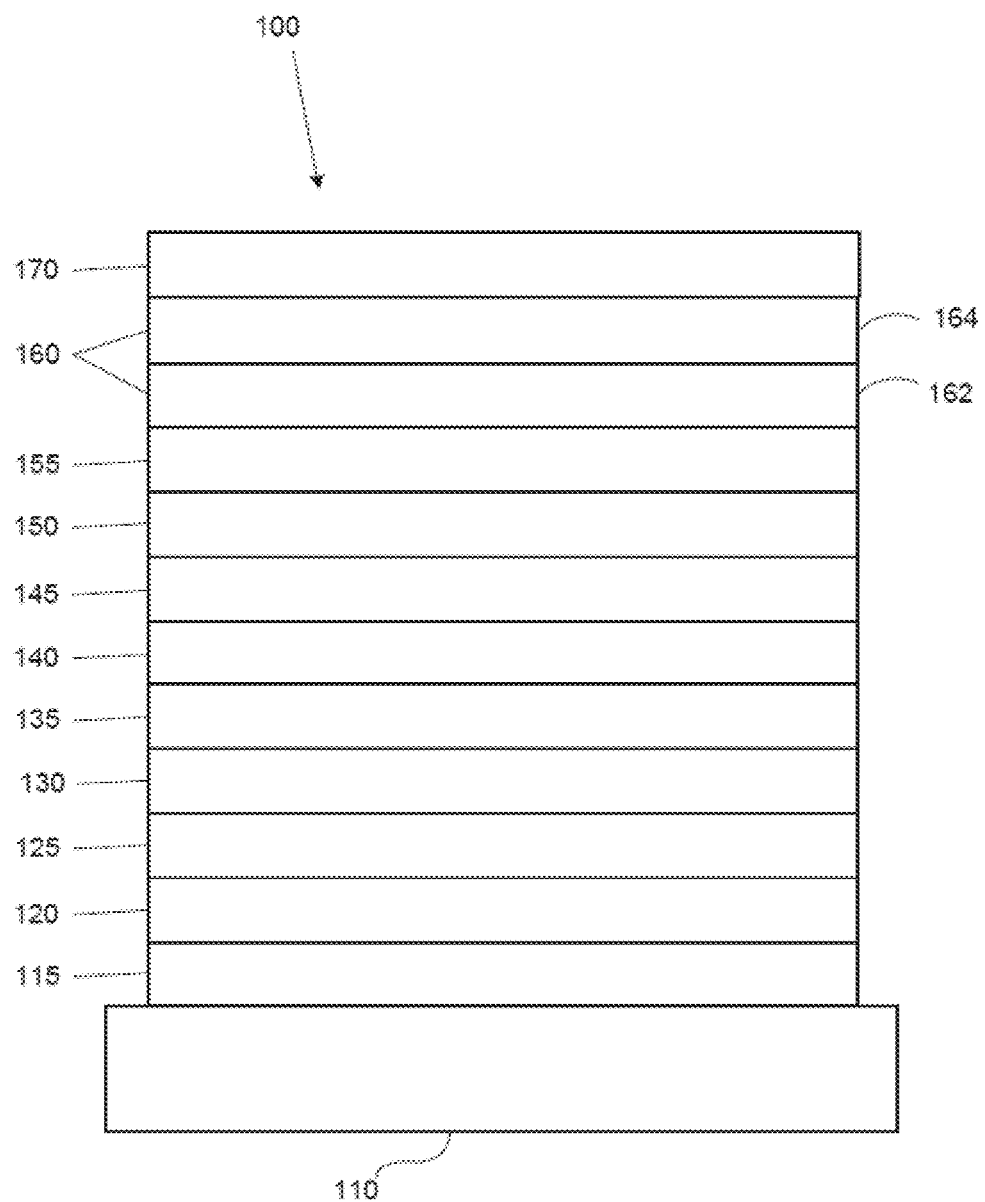
FIG. 1 shows an organic light emitting device that may be fabricated using embodiments of PDC depositors and techniques disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
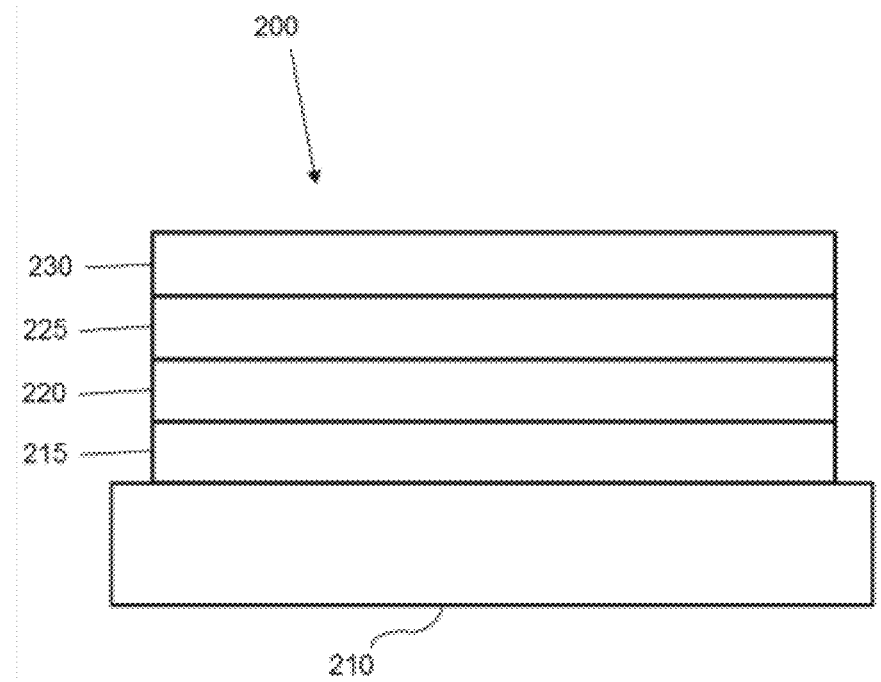
FIG. 2 shows an inverted organic light emitting device that does not have a separate electron transport layer, which may be fabricated using embodiments of PDC depositors and techniques disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, organic vapor jet printing (OVJP) is one type of technique to deposit layers of an OLED. OVJP techniques use a carrier gas to transport organic material from a heated source container to the print nozzle assembly which is in close proximity to a substrate. OVJP techniques typically are capable of depositing emissive materials in arrays of well-defined lines, which can be interlaced on a substrate surface to create a multicolor OLED display. The design of the print nozzle assembly and the deposition conditions determine characteristics of the printed line. Early OVJP print nozzles typically were capable of producing printed lines with a line width on the order of 50 μm. However, the lines had unacceptable overspray and printing could not be started and stopped rapidly. Recent OVJP techniques, such as Deposition-Exhaust-Confinement (DEC) techniques, may use a combination of delivery apertures in conjunction with exhaust apertures and a gas confinement flow to confine the line width and overspray. DEC depositors may have apertures with a wide variety of shapes, for example to produce features of specific sizes and feature profiles. Examples of specific DEC designs and techniques are described in further detail in U.S. Pub. No. 2015/0376787, U.S. Pub. No. 2015/0380648, and Int'l. Pub. No. WO/2018/023046, the disclosure of each of which is incorporated by reference in its entirety.

Figure 3:
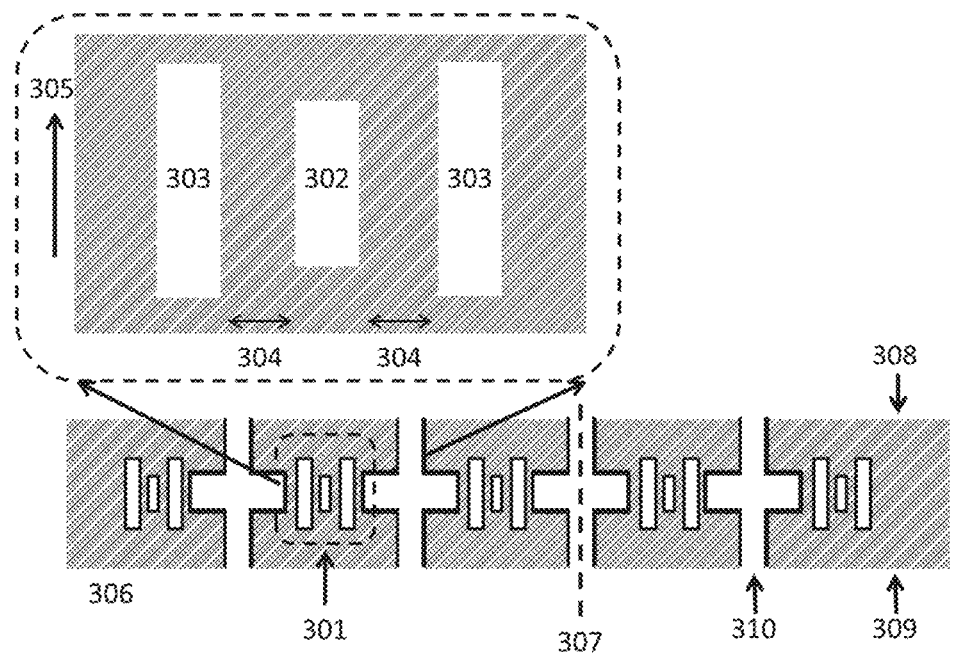
FIG. 3 shows a schematic view of a DEC depositor array with an expanded view of a single depositor.

Gas confinement techniques depart from previous OVJP concepts in that they typically use a chamber pressure in the range of 50 to 300 Torr, rather than a high vacuum environment. Overspray may be eliminated by using a flow of confinement gas to prevent the diffusion and transport of organic material away from the desired deposition region. An example of a DEC depositor design is shown from the perspective of a substrate in FIG. 3. The depositor includes a planar surface 301 that includes one or more rectangular delivery apertures 302. The delivery apertures may be disposed adjacent to, or in some embodiments between or surrounded by, exhaust apertures 303. In the example arrangement of FIG. 3 the delivery apertures 302 are disposed between pairs of exhaust apertures 303, though other arrangements may be used. During operation of the depositor, a flow of material through the delivery apertures 302 contains organic vapor entrained in an inert delivery gas. The exhaust apertures 303 withdraw gas from the region under the depositor at a mass flow rate higher than the delivery flow rate. That is, the mass flow rate of material through the exhaust aperture(s) is higher than the mass flow rate of material through the delivery apertures. Accordingly, the exhausts remove the delivery flow, surplus organic vapor entrained within the delivery flow, and a balance of confinement gas that may be drawn from the ambient surrounding the depositor. The delivery and exhaust apertures 302, 303 may be separated by a delivery-exhaust ("DE") spacer 304. In this example, the apertures are arranged such that the long axes are parallel to the direction of printing 305, though other arrangements may be used.

In DEC arrangements, the depositors typically are arranged linearly on a micronozzle array 306, so that each depositor borders another on at least one side boundary 307. The top and bottom edges 308, 309 of the depositor may be defined by the edges of the micronozzle array. Distribution trenches 310 etched into the lower face of the depositor may provide a low impedance path for confinement gas so that the confinement gas flow is evenly distributed across the side boundaries of each depositor. Alternately or in addition, confinement gas may flow in from the edges of the depositor, particularly if these channels are omitted. Arrays may be designed to minimize crosstalk between depositors so that multiple printed features are as close to identical as possible across the width of the depositor array. Additional exhaust apertures may be placed at the ends of the array, for example, to minimize edge effects. The flow field under a micronozzle array therefore has periodic symmetry.

The average thickness t of a printed film is given by $t=\eta j \tau/\rho$, where j is the mass flux of organic vapor onto the substrate, $\tau$ is the period of time a given point on the substrate is under the aperture, and $\rho$ is the density of the condensed organic material. The utilization efficiency, $\eta$, is the fraction of organic vapor issuing from the depositor that condenses on the substrate. Because $\tau=l/v$, where l is the length of the aperture in the direction of relative movement of the depositor and the substrate and v is the relative velocity between the print head and the substrate, a longer delivery aperture permits a given point on the substrate surface to remain under the aperture for a longer time at a given print speed, thereby allowing for faster printing. Accordingly, the apertures of a DEC depositor often may be made as long as manufacturing techniques will permit.

Figure 4:
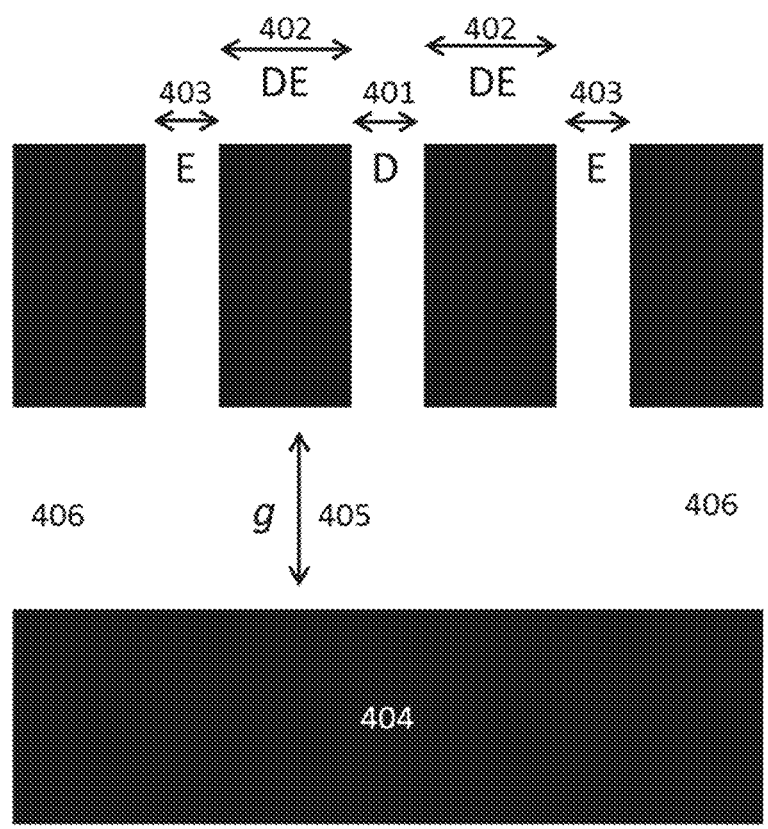
FIG. 4 shows a cross-sectional view of a single DEC depositor.

An example of a DEC depositor is shown in cross-section at a line normal to the direction of printing in FIG. 4. The width of the delivery aperture 401 is D. The mass flow rate of delivery gas through the delivery aperture is given by QD. The DE spacers between the delivery and exhaust have width DE 402 and the exhausts have width E 403. The mass flow rate of gas through the exhaust apertures of a depositor is QE. The depositor and substrate are separated by a fly height gap g 405. Confinement gas is fed into the depositor from the edges of the depositor 406 at rate QC. The flow of confinement gas opposes the outward spread of organic vapor and directs surplus organic vapor away from the deposition zone through the exhaust apertures as previously disclosed.

Figure 5A:
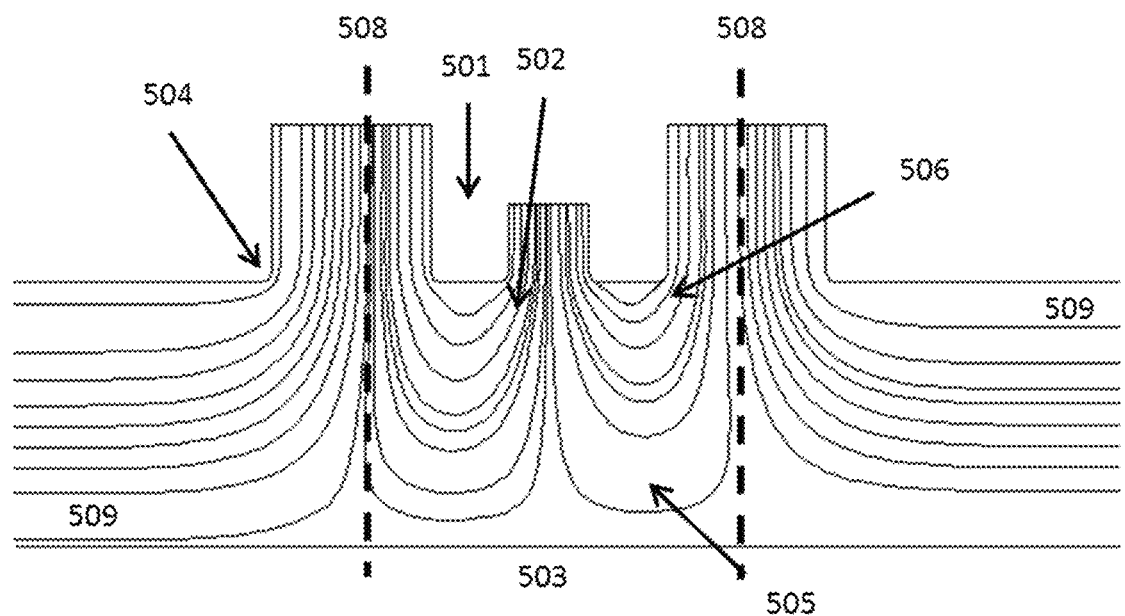
FIG. 5A and FIG. 5B show examples of simulated streamlines of flow through the cross section of two different DEC depositors.
Figure 5B:
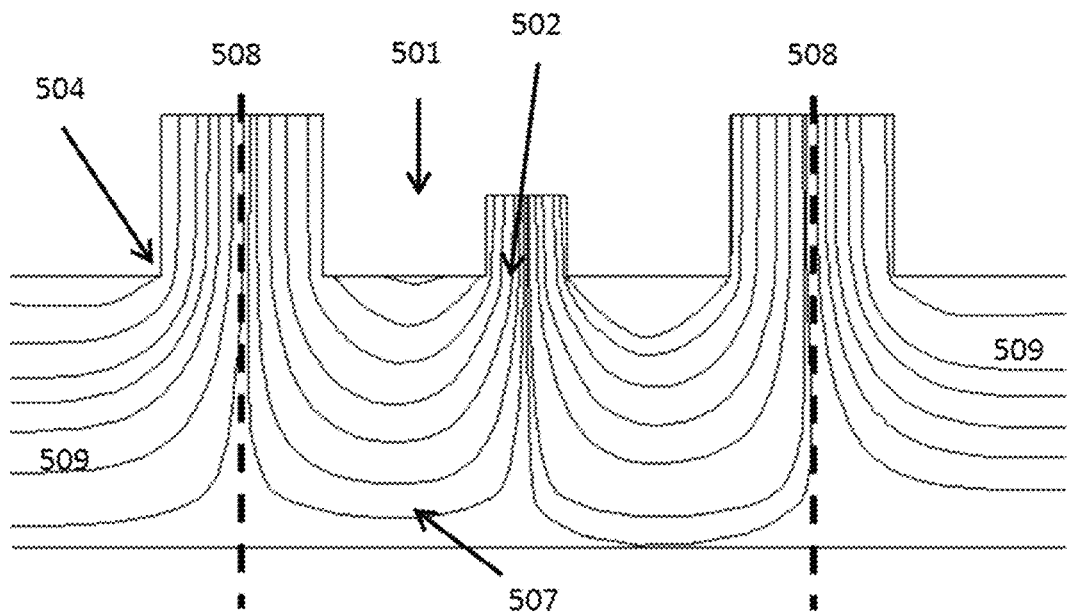

In many cases, the material utilization efficiency of a DEC depositor may be relatively poor when printing high resolution features. The DE spacer 501 may direct an organic vapor rich flow from the delivery aperture 502 into contact with the substrate 503 before it is captured by the exhaust aperture 504. FIG. 5A shows a configuration in which the DE spacer is shorter, such that the streamlines of delivery flow near the substrate 505 are sparse, indicating stagnation. Most of the delivery flow 506 travels directly to the exhaust aperture without coming into significant contact with the substrate. In contrast, for a depositor with a wider DE spacer as shown in FIG. 5B, streamlines of flow are shifted closer to the substrate 507. Accordingly, a higher portion of the organic vapor is brought into contact with the substrate.

Larger values of the DE dimension may allow organic vapor to be efficiently utilized, but they print wider features. This is because organic vapor is deposited on the region of substrate located between the stagnation planes 508 of the flow field, where the velocity in the horizontal direction is zero. Organic vapor from the delivery aperture spreads outward to the stagnation plane, but no farther, because the confinement 509 flow limits further spread and guides surplus organic vapor into the exhaust aperture. The width between the stagnation planes increases linearly with DE, so narrower DE spacers may be required to print smaller features with a DEC depositor. A tradeoff therefore exists between $\eta$ and feature size. In some configurations, $\eta$ may be 5% or lower to achieve display-sized features.

Figure 6:
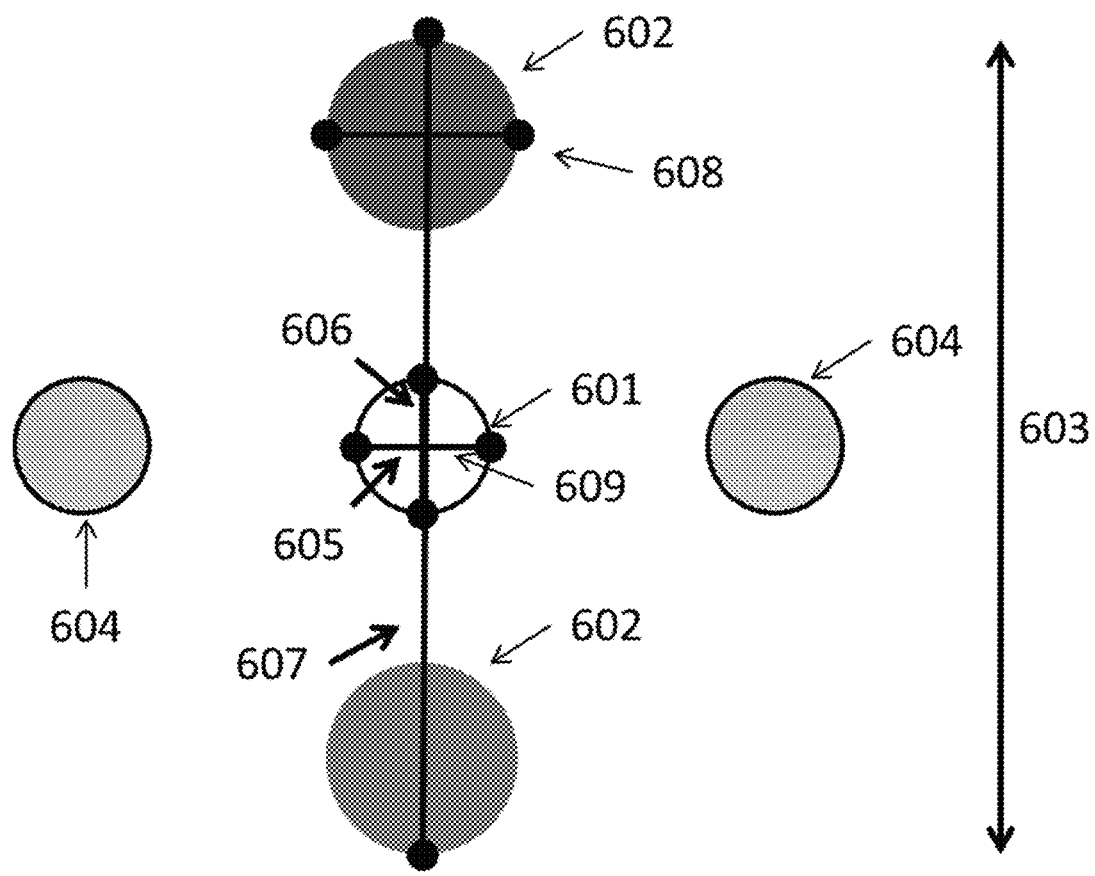
FIG. 6 shows a schematic view of an example of a PDC depositor viewed in the plane of the substrate according to embodiments disclosed herein.

In embodiments disclosed herein, a DE spacer as previously described may be aligned with the direction of printing to partially mitigate the expected tradeoff between efficiency and feature size. An example of such a configuration is illustrated in FIG. 6. In this arrangement, delivery gas is ejected through a central delivery aperture 601 as previously disclosed, and consistent with other DEC type arrangements. The delivery aperture may be surrounded by a pair of exhaust apertures 602, for example so that all three apertures lay in a line that is parallel or essentially parallel to the direction of printing 603. As used herein, features of a depositor may be described as being arranged "ahead of" or "behind" other features, referring to the placement of the features relative to one another with reference to the direction of printing. For example, the exhaust apertures 602 are disposed ahead of and behind the delivery aperture 601 in FIG. 6. Similarly, one exhaust aperture is disposed ahead of or behind the other. Typically a PDC depositor as disclosed herein may be operated by moving the depositor across a substrate along a single axis; however, the relative motion of the depositor and the substrate may be in either direction along the single axis. Accordingly, a feature that is "ahead of" another feature when the device is operating in a forward direction along the axis will be "behind" the feature when the device is operated in a rearward direction along the axis. More generally, two features may be described as being "aligned" along the direction of relative motion if a straight line parallel to the direction of relative motion exists that overlaps at least a portion of each of the two features. For example, the delivery and exhaust apertures 601, 602, respectively in FIG. 6 are aligned such that there is a straight line that overlaps at least a portion of each aperture. As a specific example, the delivery and exhaust apertures may be aligned such that the centers of the apertures lie in a straight line. As another example, the apertures may be aligned such that the center of each aperture lies within a threshold distance of a straight line that overlaps all the apertures, such as within 5% of the maximum width of the aperture. It may be preferred for the apertures to be centered along a common axis that is parallel to the direction of printing.

Two or more confinement gas apertures 604 may be located to either lateral side of the delivery aperture relative to the direction of printing 603. As used herein, depositor features may be described as being "laterally adjacent" to one another if there exists a straight line perpendicular to the relative motion of the depositor and the substrate when the depositor is operated to deposit material on the substrate, such that each of the two "laterally adjacent" features at least partially overlaps the straight line.

A similar, but different arrangement is described in U.S. Pub. No. 2015/0376787. Although the individual operation of the delivery, confinement, and exhaust apertures is similar in the '787 publication and this disclosure, the specific arrangement and resulting gas flows may be significantly different. For example, the '787 publication generally describes configurations in which exhaust apertures are arranged between the delivery apertures and confinement gas sources. That is, DEC-type depositors generally use configurations in which the exhaust apertures would be located at the location of the confinement gas apertures 604 in FIG. 6, and confinement apertures located outside of the exhaust apertures (i.e., toward the closest outer edge of the depositor nozzle block relative to the exhaust aperture). PDC depositors as disclosed herein arrange the confinement apertures 604 and exhaust apertures 602 as shown.

In further contrast to such DEC depositors, embodiments disclosed herein provide delivery and confinement flows that are both non-zero and parallel to each other across the boundary between the two. These parallel delivery and confinement (PDC) depositors may be contrasted to the arrangements and operation of DEC configuration depositors in which the in-plane motion of the delivery and confinement flows were in opposition to each other at their interface rather than parallel. As disclosed in further detail herein, PDC configurations may offer advantages in material utilization efficiency and relaxed fly height tolerances, while preserving acceptable printing resolution and feature thickness uniformity.

A PDC depositor as disclosed herein may be adequately described and defined by three general geometric properties. The first is that collinear segments passing through the center of the depositor 605 should exist such that a first segment 606 begins and terminates on the outer edge of a delivery aperture, and the second segment 607 begins and terminates on the outer edge of an exhaust aperture. In addition, it may be preferred that the second segment 607 is longer than the first segment 606. The extent of a depositor's exhaust aperture system generally is greater than that of the delivery aperture system. It is desirable that every section of delivery aperture 601 is separated from the nearest section of confinement aperture 604 by a solid section of the depositor surface.

The second geometric property of a PDC depositor as disclosed herein is that the maximum width of the exhaust aperture system 608, from outside edge to outside edge, is less than the intended size of the printed features. For example, to print a 50 μm square feature, the width of the exhaust aperture 608 should not be more than 50 μm. As used herein in reference to these geometries, a "width" refers to the distance of a feature in a direction that is orthogonal both to the direction of printing and to the substrate normal. In the view shown in FIG. 6, the direction of printing 603 is toward the top or bottom of the page, and the substrate normal is in a direction orthogonal to the direction of printing and out of the page. Accordingly, the "width" of the exhaust aperture 608 refers to the distance across the page from left to right.

The third geometric property of a PDC depositor as disclosed herein is that the maximum width of the delivery aperture system 609 also is less than the intended size of the printed features. The "width" of the delivery aperture system 609 as used herein again has the meaning as described above with respect to the exhaust apertures 608.

Embodiments of PDC depositors disclosed herein may exhibit confinement that is less sharp than with DEC type depositors. However, the delivery flow may follow a longer path between the delivery aperture from which it originates and the exhaust aperture that removes unused material and carrier gas from the region between the depositor and the substrate. This means that the organic material in the delivery flow has more time during which it can deposit on the substrate, leading to more efficient utilization of organic material.

Figure 7A:
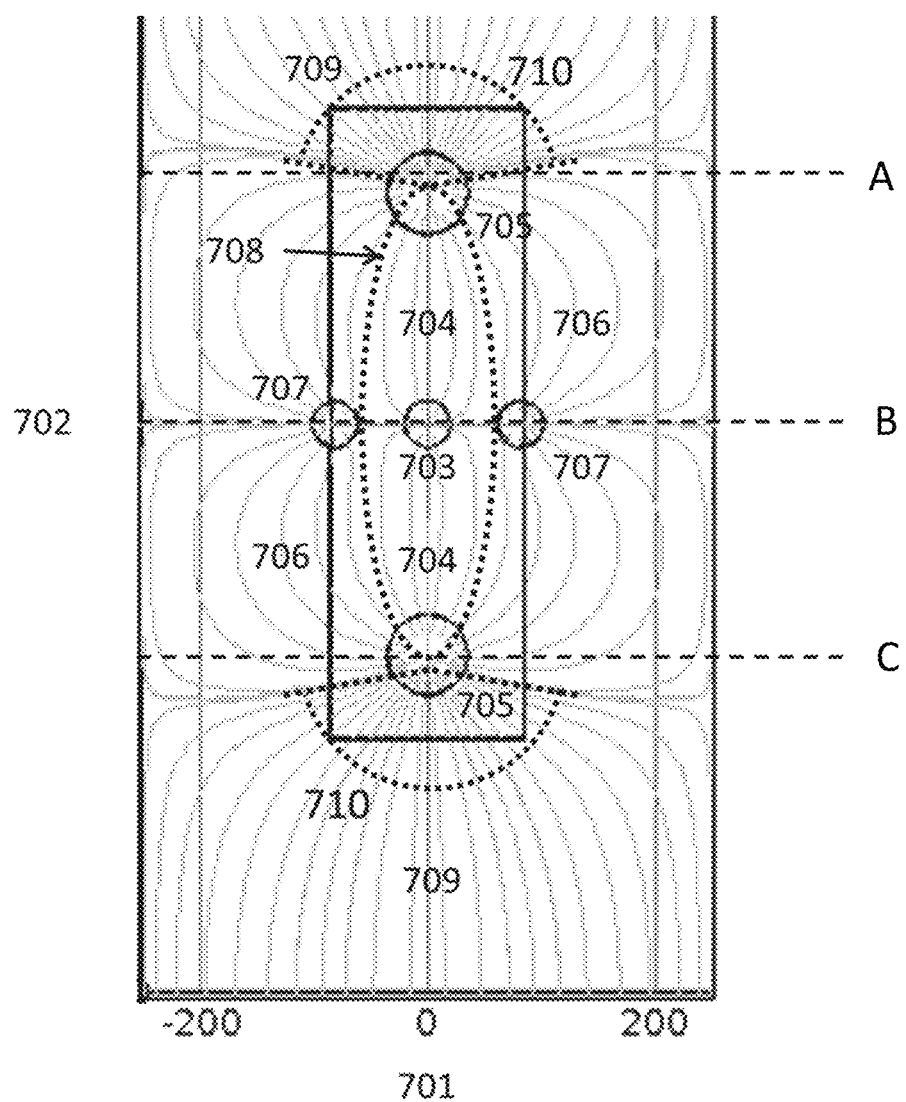
FIG. 7A shows simulated streamlines of flow through a PDC depositor according to embodiments disclosed herein in the plane of the substrate.

FIG. 7A shows an example of the patterns of flow that may be generated by a depositor as described with respect to FIG. 6. The horizontal axis 701 gives displacement in the x direction (i.e., orthogonal to the direction of printing and parallel to the substrate) in microns and the vertical axis 702 gives displacement in they direction (i.e., parallel to the direction of printing) in microns with respect to the center of the delivery aperture 703. The delivery flow 704 passes from the delivery aperture to the exhaust apertures 705.

As previously disclosed, the delivery flow 704 may be surrounded by a confinement flow 706 that passes from the confinement apertures 707 to the exhaust apertures 705. Notably, the majority of organic material entrained in the carrier gas remains with the streamlines of the delivery flow 704, confining it to a pocket 708 that is bounded by the intersection of the delivery and confinement flows 704, 706.

The velocity distribution at this intersection is constant and non-zero. Therefore, the delivery and confinement flows 704, 706 flow parallel to each other at the flow interface. This may be contrasted with the flows in a DEC depositor as previously disclosed and as described, for example, in U.S. Pub. No. 2015/0376787, in which the flows are anti-parallel.

A secondary stream of confinement flow 709 may enter or be provided from the depositor edges. The confinement flow 709 may be actively provided, such as via a source of confinement gas similar to that provided with the confinement flow 706, or it may result from conditions in the chamber ambient without a separate generation or delivery mechanism for the flow 709. The confinement flow 709 may create a generally arc-shaped region 710 around at least a portion of the exhaust aperture 705 that prevents delivery flow 704 from being pulled to the far side of the aperture 705 and thereby widening the deposition zone. That is, the additional confinement flow 709 displaces organic vapor so that it only enters the exhaust aperture on a side facing the delivery aperture and prevents the convective action of the exhaust from broadening the organic vapor plume. This may prevents undesirable overspray or enlarged and/or less-well-defined features.

FIG. 7B shows a schematic of the same flow pattern as in FIG. 7A, along a cross section taken parallel to the direction of printing. As previously disclosed, the delivery flow 704 (in FIG. 7A) is brought into contact with the substrate 712 across the length of the DE spacer 713, which is parallel to the direction of printing. The additional confinement flow fed from the edge of the depositor creates a stagnation plane 714 that bounds the spread of delivery flow along the direction of printing as previously disclosed. This is analogous to DEC-type arrangements such as disclosed in U.S. Pub. No. 2015/0376787, in which confinement flow prevents spread perpendicular to the direction of printing.

Examples of cross-sectional thickness profiles for features printed with a PDC depositor as illustrated in FIGS. 6 and 7A-7B are shown in FIG. 8. The horizontal axis 801 shows the relative displacement from the depositor centerline in the x direction (i.e., across the substrate perpendicular to the relative motion of the depositor and the substrate). The vertical axis shows the local flux of organic vapor j at that position in arbitrary units. The shape of the curve is therefore equivalent to the thickness profile of a feature printed with the depositor. The four clusters of lines represent features grown with depositors with DE spacing of 100 μm (803), 200 μm (804), 300 μm (805), and 400 μm (806). It can be seen from these results that, for a PDC depositor in this configuration, a primary determinant of both the maximum feature thickness and the feature size is DE. As used in this example, the "feature size" refers to the full width of the profile at 5% of its maximum value (FWSM), an example of which is marked for the DE=200 μm case as 807. Streamlines, printed feature thickness profiles, efficiency estimates and other performance data presented for PDC depositors as disclosed herein were obtained by simulation of the various embodiments disclosed herein using computational fluid dynamics software.

As previously disclosed, the diffusion of organic material from a delivery flow to the relatively stagnant layers of gas immediately above the substrate allows for deposition of the organic material on the substrate. However, diffusion of the organic material between the delivery and confinement flows generally results in a broadening of features printed by the depositor. The time available for both processes increases with greater spacing between the deposition and exhaust apertures. That is, a higher DE spacing generally leads to both an increase in the amount of material deposited and/or efficiency in the deposition of organic material, as well as the undesirable broadening of printed features. As with DEC depositors, a tradeoff exists between and the printed feature size. However, as indicated by the results shown in FIG. 8, it may be less severe for PDC geometries as disclosed herein when compared to DEC depositors and other OVJP depositor arrangements.

Still referring to FIG. 8, the individual profiles in each cluster 803, 804, 805, 806 reflect profiles generated by PDC depositors with different delivery-to-confinement (DC) spacing. Profiles for DC spacings of 50 μm (807), 80 μm (808), 110 μm (809), and 130 μm (810) DC spacings are shown. As FIG. 8 indicates, PDC depositors with larger DC spacing will tend to print features with more uniform deposition profiles that are less sharply peaked in the center. For example, the profile for a DC spacing of 130 μm at 810 has a profile with a broader center peak and more uniform width than the profile for the 50 μm DC spacing 807.

For DE spacing of less than about 300 μm, the FW5M is seen to increase slightly with increasing DC. However, for DE spacings of about 300 μm or greater, the FW5M is seen to decrease slightly with increasing DC. A larger DC spacing will require the confinement gas to flow further inward along the x axis before reaching an exhaust aperture, thereby reducing the outward spread of organic vapor in the delivery flow. The feature profiles for a DE spacing of 400 μm at 806 intersect with each other at 811 because the larger DC spacing produces a feature with a broader center and narrower outer edge tails, while a smaller DC spacing produces a profile with a narrower center and broader tails. A wider DC spacing also improves η for relatively small values of DE because the wider spacing initially causes the organic vapor to spread over a wider region over the substrate, but the effect becomes less significant with increasing DE spacings.

FIG. 9 shows deposition rate data for example depositors as shown in FIG. 6, which plots the normalized total deposition rate J (902) as a function of DE spacing of the depositor in microns at 901. The total organic flux J shown at 902 is j as previously disclosed, integrated across the width of the deposited feature. It can be seen that larger DE spacings result in higher total deposition rates for each flow rate (2, 4, and 6 sccm).

FIG. 10 shows material utilization efficiency η 1001 for the same depositor configurations as a function of depositor DE spacing 901. It can be seen that a larger DE spacing increases the time available for organic vapor to diffuse out of the delivery flow and adhere to the substrate, thereby causing an increase of both J and η as previously disclosed. Notably, J is almost independent of QD for DE spacing of under about 200 μm. In such configurations, the DE spacing is not sufficient for a diffusive boundary layer to develop over the substrate. It also can be seen that the difference in deposition rates between depositors having a mass flow rate through the delivery aperture (QD) of 2 sccm (1002) and 4 sccm (1003) increases notably for DE over about 200 μm. However, the difference in J between mass flow rates of 4 sccm (1003) and 6 sccm (1004) remains relatively insignificant over the observed rage of DE.

These results can be explained, in part, because the additional material ejected from the delivery aperture at higher QD values may not permeate to the substrate before it is extracted through an exhaust aperture. Material utilization therefore becomes less efficient, and η and QD may have a nearly reciprocal relationship for DE spacings of about 200 μm or less. The relationship between η and QD becomes less sensitive at higher DE values, but in general η still decreases as QD increases.

Figure 7B:
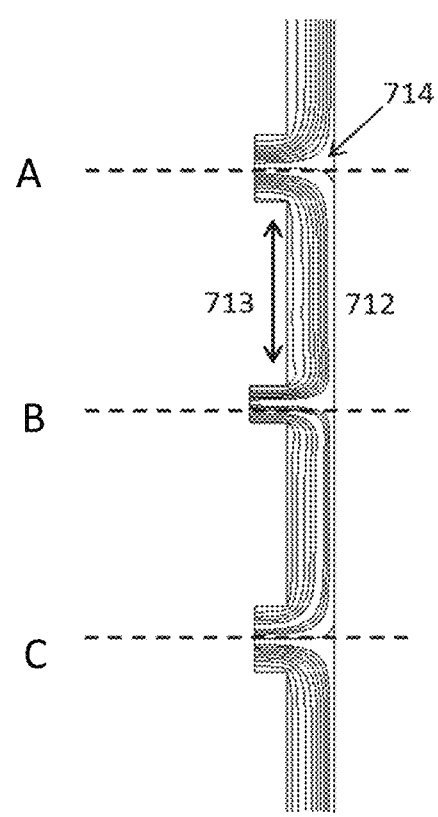
FIG. 7B shows a cross-sectional view of simulated streamlines of flow through a PDC depositor according to embodiments disclosed herein along the direction of printing.
Figure 8:
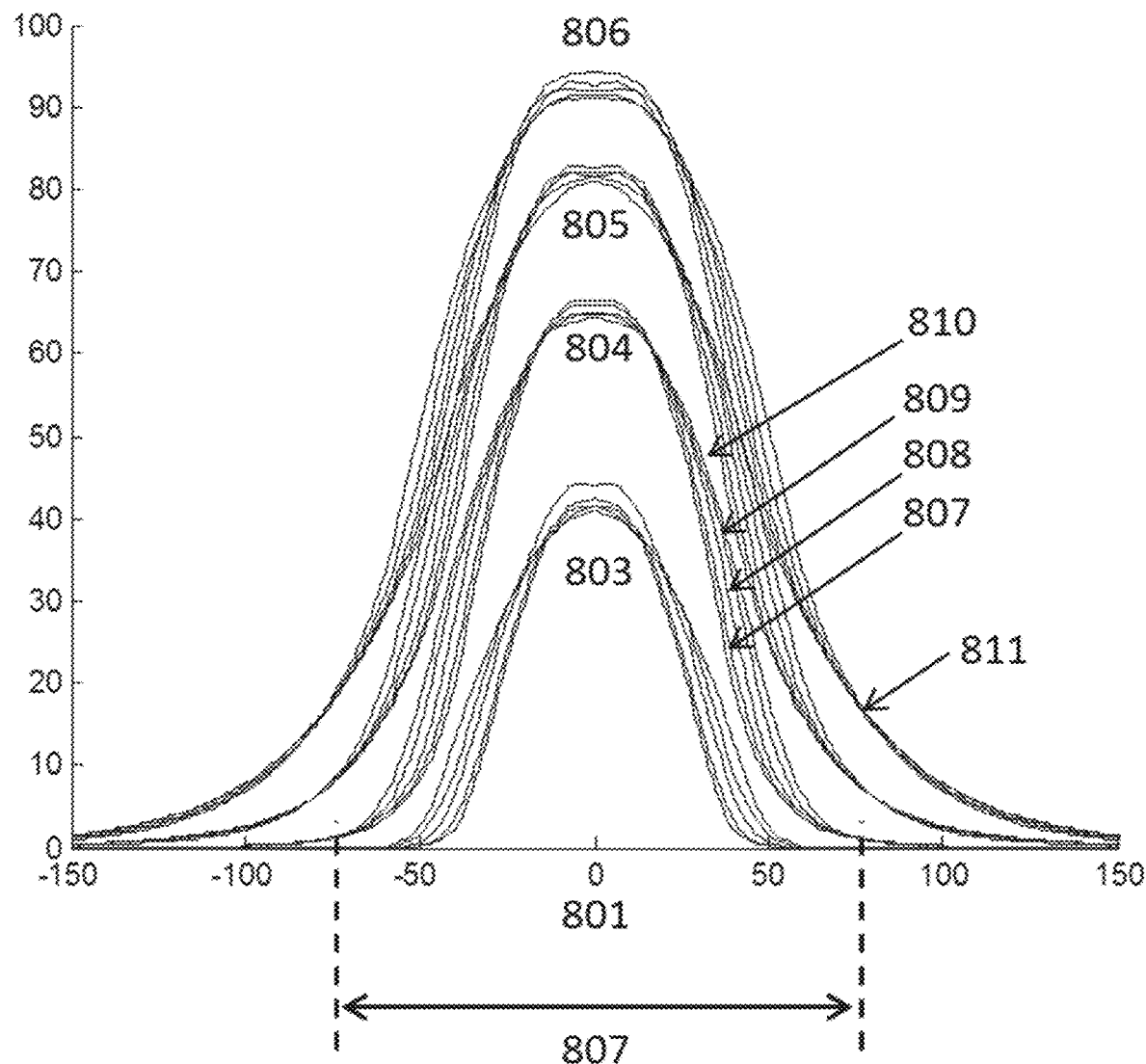
FIG. 8 shows simulated thickness profiles of features printed using PDC depostiors according to embodiments disclosed herein.
Figure 9:
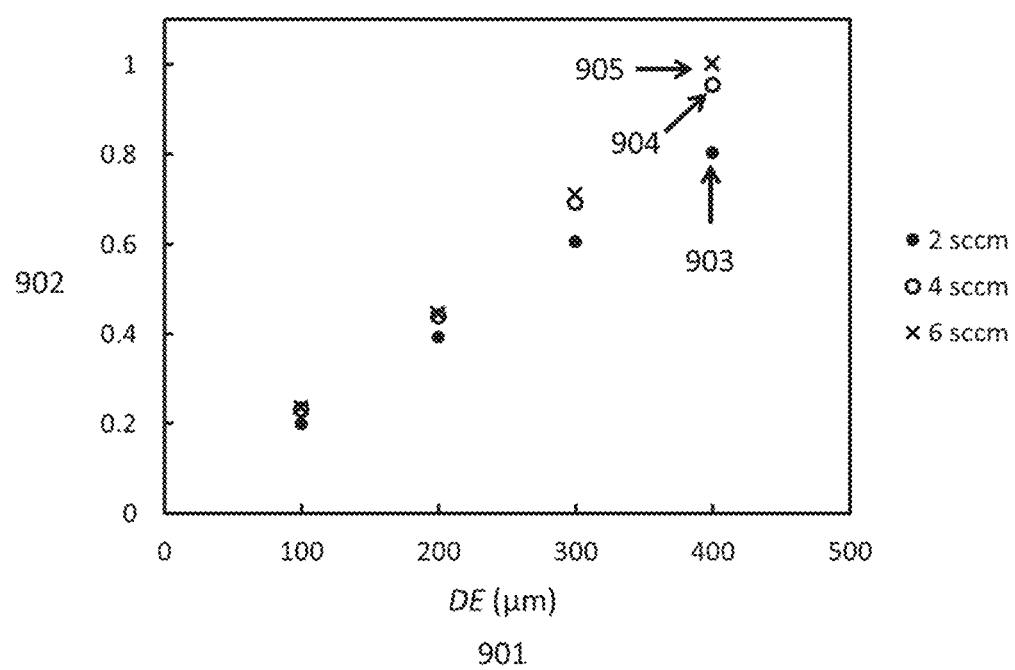
FIG. 9 shows simulated normalized deposition rates of PDC depositors according to embodiments disclosed herein, operated at different delivery flow rates as a function of DE spacer length.
Figure 10:
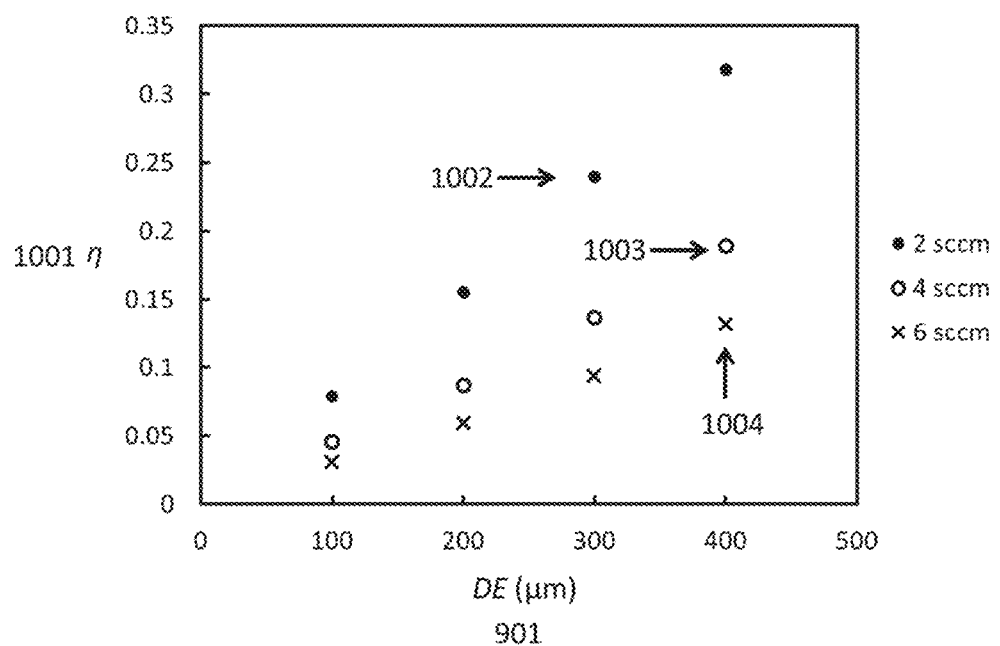
FIG. 10 shows the simulated material utilization efficiency of PDC depositors according to embodiments disclosed herein operated at different delivery flow rates as a function of DE spacer length.
Figure 11A:
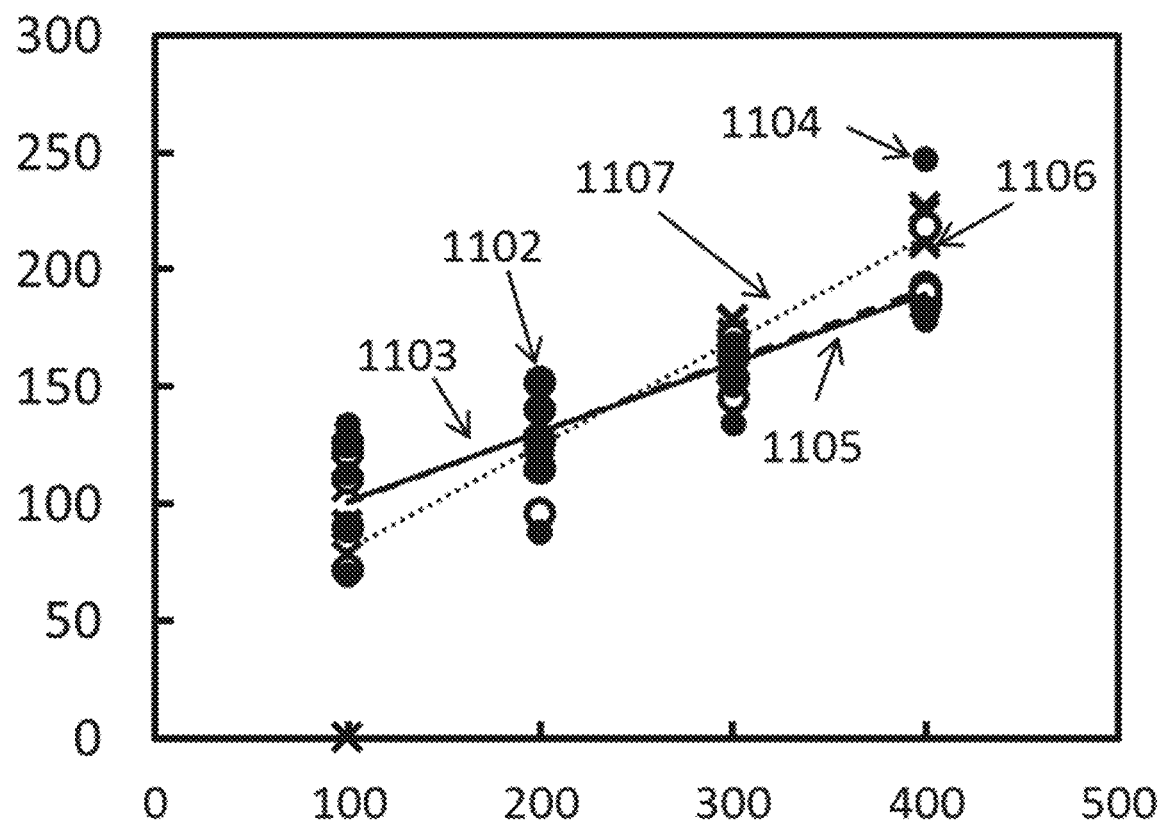
FIG. 11A shows the size of feature printed by PDC depositors with various DC separations according to embodiments disclosed herein.

Feature size trends for the features shown in FIG. 8 using a depositor configuration as shown in FIGS. 6-7 are illustrated in FIG. 11A, which shows the FW5M (full width to 5% of profile maximum) of the printed feature in microns as a function of the DE spacing of the depositor. As this plot illustrates, it has been found that the length of the depositor DE spacing has the most apparent effect on feature size, with feature size increasing linearly or almost linearly with DE size.

The next most significant effect on feature size depends on the value of the DC spacing of the depositor. Feature sizes of features printed by a depositor are shown for DC spacings of 20 μm (filled dots 1102 connected by a solid line 1103), 80 μm (open dots 1104 connected by a dashed line 1105), 110 μm (Xs 1106 connected by a dotted line 1107), and 130 μm (filled triangles 1108 connected by a dot-dash line 1109). As previously noted, it is found that increasing the DC distance increases the FWSM of the resulting features when the DE distance is less than about 300 μm, and decreases the feature FWSM otherwise. As a specific example, the FWSM of a feature printed by a PDC depositor as shown in FIGS. 6-7 with DE of 300 μm reduces from 169 to 151 μm as the DC separation increases from 80 to 110 μm.

Figure 11B:
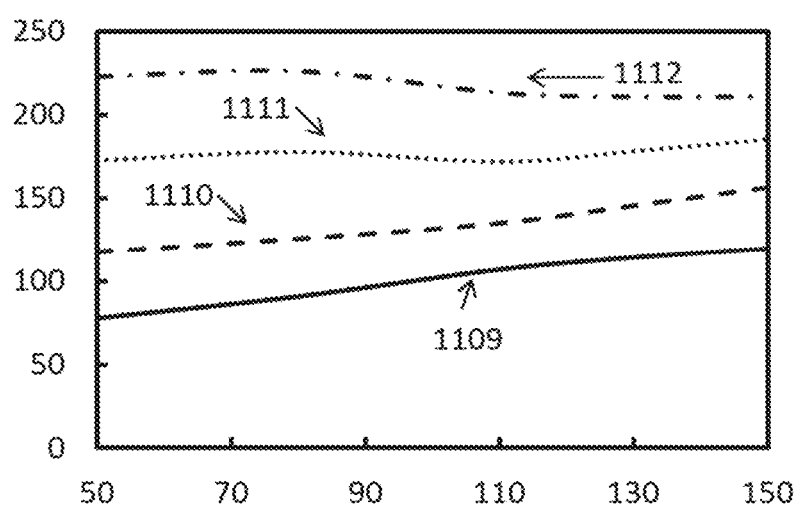
FIG. 11B shows the size of features printed by PDC depositors when operated at different delivery flow rates as a function of DE spacer length according to embodiments disclosed herein.
Figure 12A:
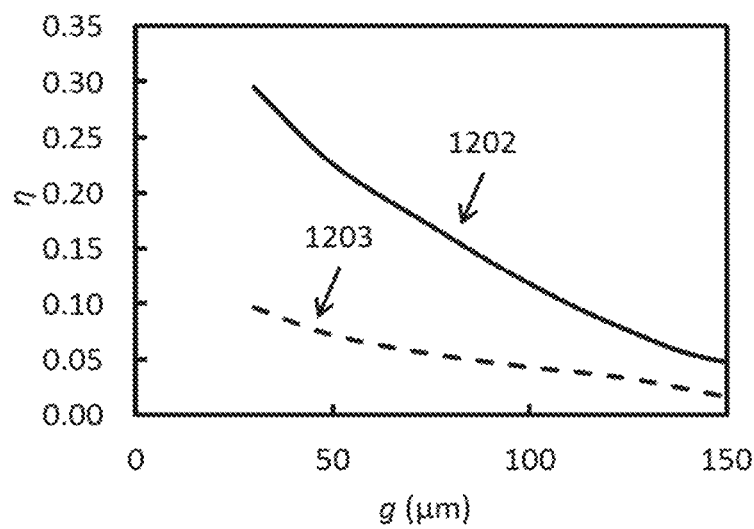
FIG. 12A shows deposition rate for both DEC and PDC nozzles as a function of fly height according to embodiments disclosed herein.
Figure 12B:
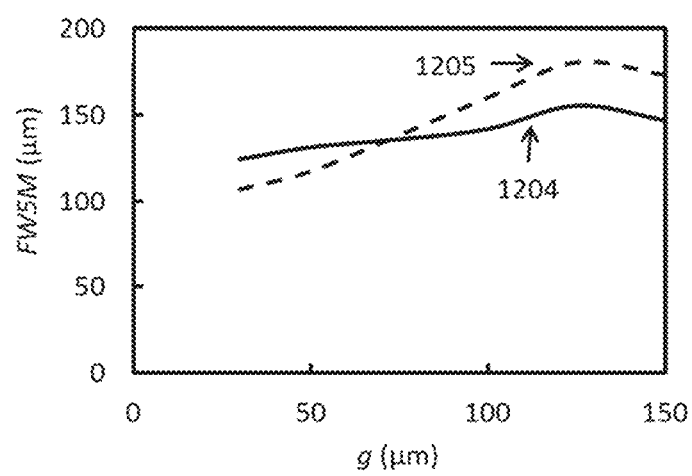
FIG. 12B shows printed features sizes for both DEC and PDC nozzles as a function of fly height according to embodiments disclosed herein.
Figure 13A:
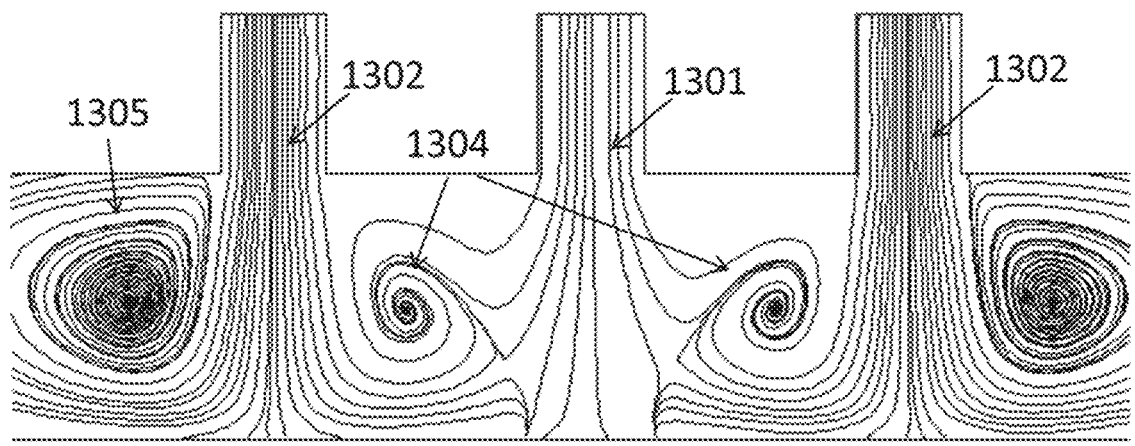
FIGS. 13A and 13B show streamlines of flow generated by a PDC depositor according to embodiments disclosed herein, viewed along a cross section normal to the direction of printing with straight and chamfered apertures, respectively.
Figure 13B:
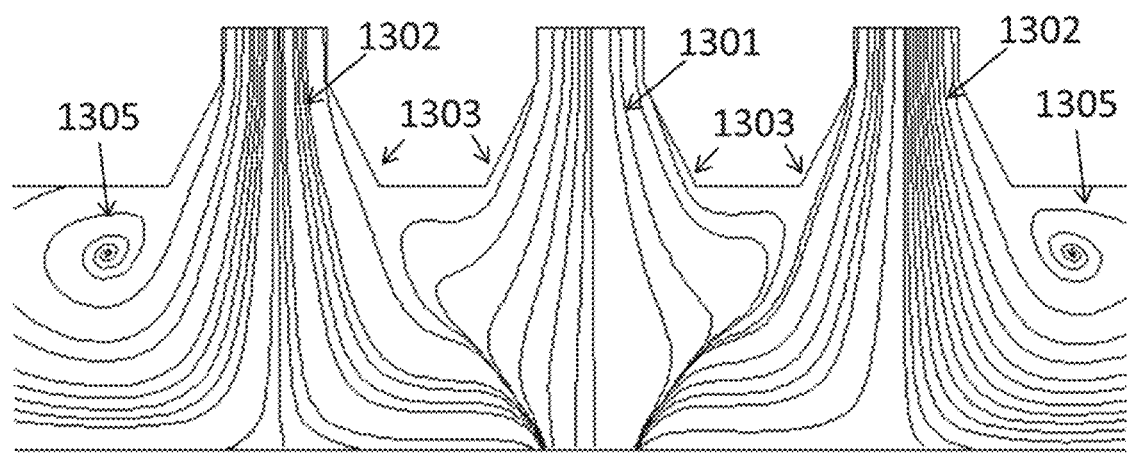
Figure 14A:
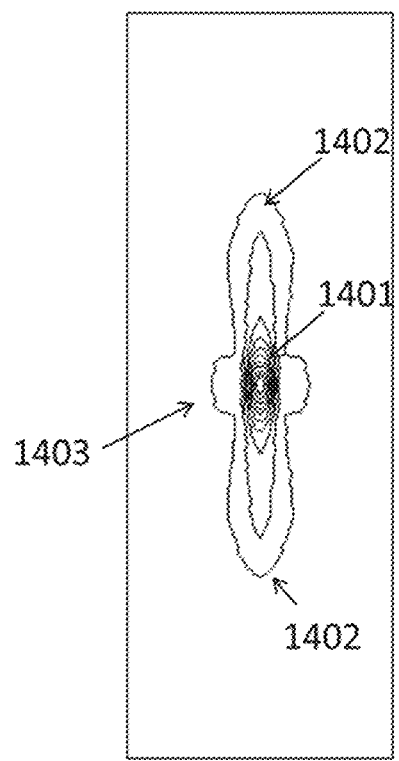
FIGS. 14A and 14B shows the fields of organic flux onto a substrate generated by depositors with and without chamfered apertures, respectively, viewed from above the substrate, according to embodiments disclosed herein.
Figure 14B:
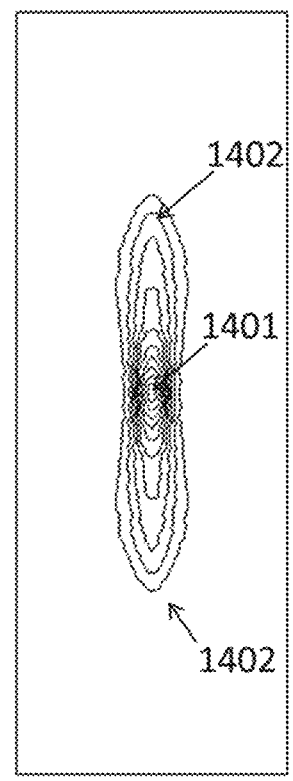

Similarly, FIG. 11B shows the printed feature width in microns as a function of the DC distance of the depositor in microns for DE distances of 100 μm (1109), 200 μm (1110), 300 μm (1111), and 400 μm (1112) at a QD flow rate of 2 sccm. As shown, it has been found that the feature size increases with DC at relatively short DE lengths because the larger DC distance increases the width of the initial deposition zone under the delivery aperture. Conversely, the printed feature width decreases at higher DC distances when the DE distance is larger. This is because the inward convection of carrier gas from the more widely-spaced confinement apertures towards a centrally-positioned exhaust counteracts the outward diffusion of organic vapor in the delivery flow.

The total deposition mass flow rate QD has a relatively small or negligible effect on the printed feature size, presuming that the values of QE and QD for the depositor are scaled proportionately. The three separate points plotted for each set of DE and DC conditions in FIG. 11A represent FW5M values for QD=2, 4, and 6 sccm. For all other examples discussed with reference to FIGS. 8-11, QE/QD=4 and QC/QD=1.5. It has been found that the printed feature sizes cluster together despite the different gas flow rates.

The result that feature size is independent of flow rate is unexpected. Such a result is counterintuitive because diffusion between adjacent flows of delivery gas and confinement gas generally causes broadening of the printed features. The expected broadening therefore depends on the total time that the organic vapor remains below the depositor, and therefore on the gas velocity. This apparent contradiction can be explained by noting that only organic vapor from the closest fluid laminae are able to reach the substrate at high delivery flow rates. The velocity of these laminae is much slower than that of the bulk. The motion of delivery gas near the substrate is largely unaffected by the overall flow rate, and therefore so is the feature size.

The length of the DE spacer defines the characteristic length of the of the flow field underneath a DEC depositor. A delivery jet therefore generally is unable to cross a fly height gap g between the substrate and the lower surface of the depositor of more than about 2-3 times the DE distance to deposit organic vapor onto the substrate. The performance of a DEC depositor therefore may decrease significantly at greater fly heights. In contrast, a larger DE spacing in a PDC depositor configuration as disclosed herein allows the PDC depositor to be operated at greater fly heights, thereby reducing the risk of collision between the depositor and substrate under production conditions.

Figure 15:
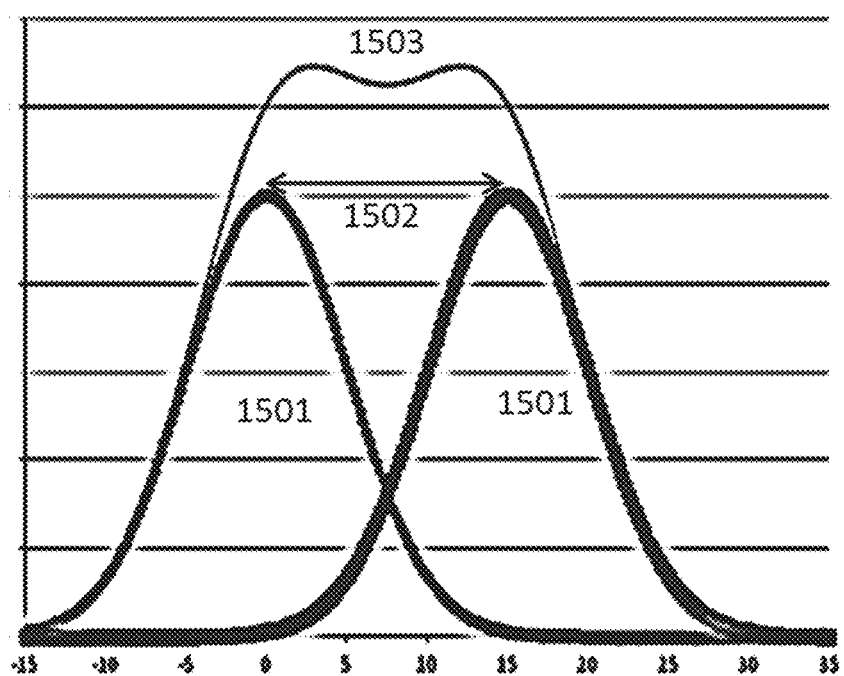
FIG. 15 show how two printed features with non-uniform thickness overlapped to generate a composite feature according to embodiments disclosed herein.

FIG. 12A shows a plot of the material utilization efficiency η as a function of the fly height g for a DEC depositor and for a PDC depositor as disclosed herein. The material utilization efficiency decreases with increasing fly height for both depositor designs. However, it has been found that the PDC depositor design may have three times the efficiency of a comparable DEC depositor over the studied range of fly heights. The efficiency curve for the PDC depositor is shown as a solid line 1202 and the curve for the DEC depositor is shown as a dashed line 1203. A PDC depositor can be operated with η=0.1 at g=100 μm, while a comparable DEC depositor typically would have to be held within g=30 μm to achieve comparable performance.

FIG. 12B shows plots of the FW5M expected from features printed with a PDC depositor 1204 as disclosed herein, in comparison to a DEC depositor 1205. It can be seen that the feature size is more stable across a range of fly heights for the PDC depositor than the DEC depositor. For example, if the maximum permissible feature size is 140 μm, a PDC depositor may be operated at a fly height g of 100 μm, while a comparable DEC depositor may require a fly height of 75 μm or less. As shown by FIG. 12B, a PDC depositor as disclosed herein expands the range of fly height over which the depositor is able to meet required material utilization efficiencies or feature specifications.

Circular apertures with straight sidewalls, as illustrated in FIGS. 6 and 7, may generate eddies that can create unwanted mixing between the delivery and confinement flows at higher QD values. Some embodiments of PDC depositors as disclosed herein prevent or suppress such eddies by using chamfered sidewalls surrounding the aperture. Examples of flow fields generated by non-chamfered sideweall PDC depositors and chamfered depositors are shown in FIGS. 13A and 13B, respectively. In FIG. 13A, delivery flow is injected to the depositor cross section through straight-walled delivery apertures 1301 and confinement apertures 1302. FIG. 13B shows a similar configuration in which the delivery and confinement apertures have chamfered sidewalls 1303. It has been found that the straight apertures may produce a recirculation cell 1304 between the delivery and confinement apertures 1301, 1302, and even stronger recirculation cells 1305 on the outside of the confinement apertures 1302. The recirculation cell between the delivery and confinement apertures disappears for chamfered sidewalls, and the outside recirculation cells are greatly minimized.

The lack of these recirculation zones in the chamfered arrangement significantly reduces or eliminates convective mixing between the delivery and confinement flows. This can be seen from the organic flux contours plotted in FIGS. 14A and 14B for the straight and chamfered sidewalls cases, respectively. The straight sidewall arrangement in FIG. 14A exhibits a zone of high organic flux 1401 near the center, with long lobes of deposition 1402 extending outward along the direction of printing. Additional lobes of deposition 1403 extend laterally outward from the center orthogonal to the direction of printing. These regions of deposition broaden the printed feature, but they may be reduced or eliminated if the delivery and confinement apertures are chamfered as shown in FIG. 13B.

In some embodiments, it may be desirable to use multiple passes of a depositor over a substrate to achieve a desired printed feature geometry or arrangement. For example, for a total mass flow rate QD of 2 sccm of $N_2$ delivery flow at chamber pressure, the optimal DE spacer length is 250 µm. With a DC distance of 50 µm and a fly height g of 50 µm, features having a FW5M of 120 µm can be printed using a PDC depositor as disclosed herein with delivery and confinement apertures of 20 µm in diameter and exhaust apertures of 35 µm in diameter. Material utilization efficiency of such a device is approximately 20%, which is approximately twice the efficiency that is believed to be achievable with a comparable DEC depositor. However, feature uniformity from the PDC depositor may not be sufficient to permit printing of an electronically useful thin film, such as for use in an OLED as described with respect to FIGS. 1-2, in a single pass. Accordingly, in some embodiments a feature may be printed in two or more passes. FIG. 15 shows a deposition profile resulting from two passes with a PDC depositor as disclosed herein. Two identical features 1501 that are deposited in separate passes may be offset from each other by a distance 1502, thereby causing an overlap to create a composite feature 1503 with the required thickness uniformity over a desired width about the feature center. The separation distance 1502 may be determined based upon a calculated or measured feature profile and/or width, such as described with reference to FIGS. 8-12.

Figure 16:
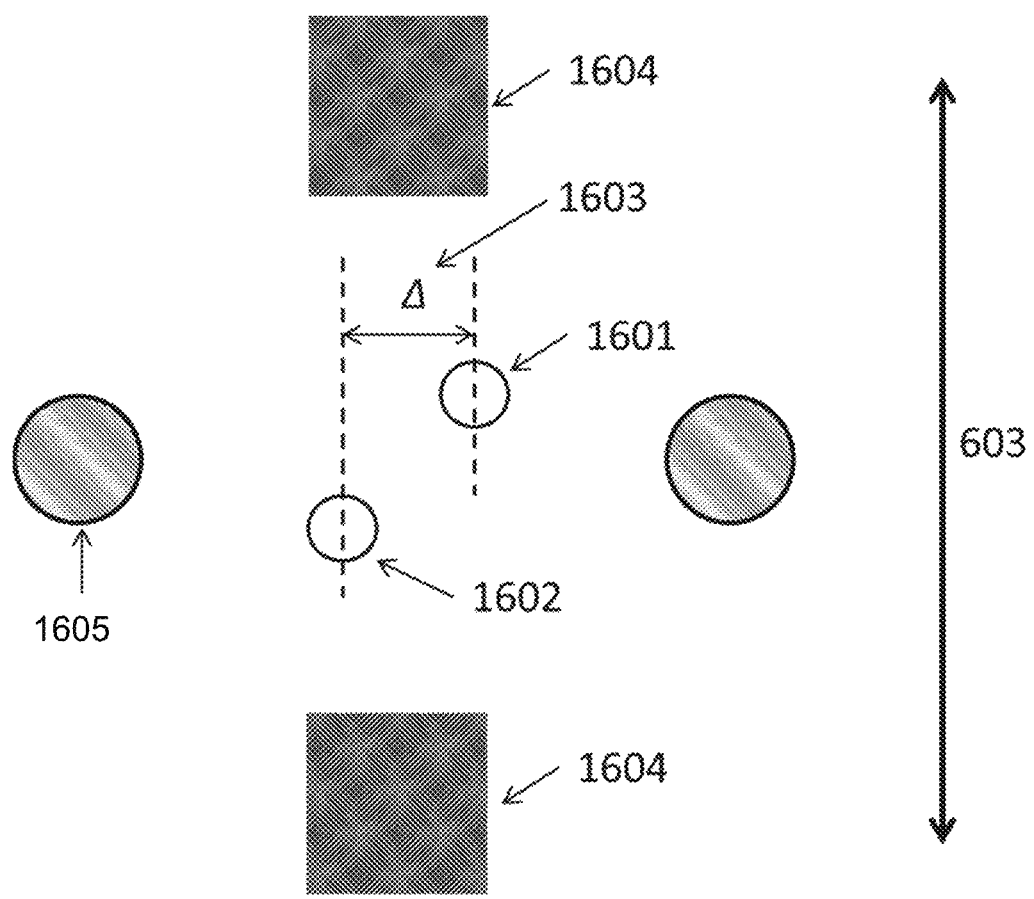
FIG. 16 shows a schematic view of an example PDC depositor configuration that deposits a highly uniform composite feature in a single pass using overlapping depositions according to embodiments disclosed herein.

Alternatively or in addition, a highly-uniform feature may be achieved using a depositor of the kind depicted in FIG. 16. In this arrangement, a first delivery aperture 1601 may be offset from a second delivery aperture 1602 by a distance Δ 1603 measured perpendicular to the direction of printing 603. As previously disclosed, two or more exhaust apertures 1604 may be positioned at equidistant points along the centerline of the depositor, parallel to the direction of printing. Confinement apertures 1605 as previously disclosed may be positioned on each outer side of each delivery aperture.

The delivery, exhaust, and confinement apertures may be circular, oval, rectangular, or any other desired shape, as previously disclosed. For example, the exhaust apertures 1604 in this configuration may be square to improve the thickness uniformity of the printed features. A circular exhaust aperture 1604 may be used to create differing path lengths for delivery flow along the width of the depositor. This directs streamlines of delivery flow towards the centerline of the depositor, creating a more sharply peaked deposition profile and reducing the benefit of distributed delivery apertures.

Figure 17:
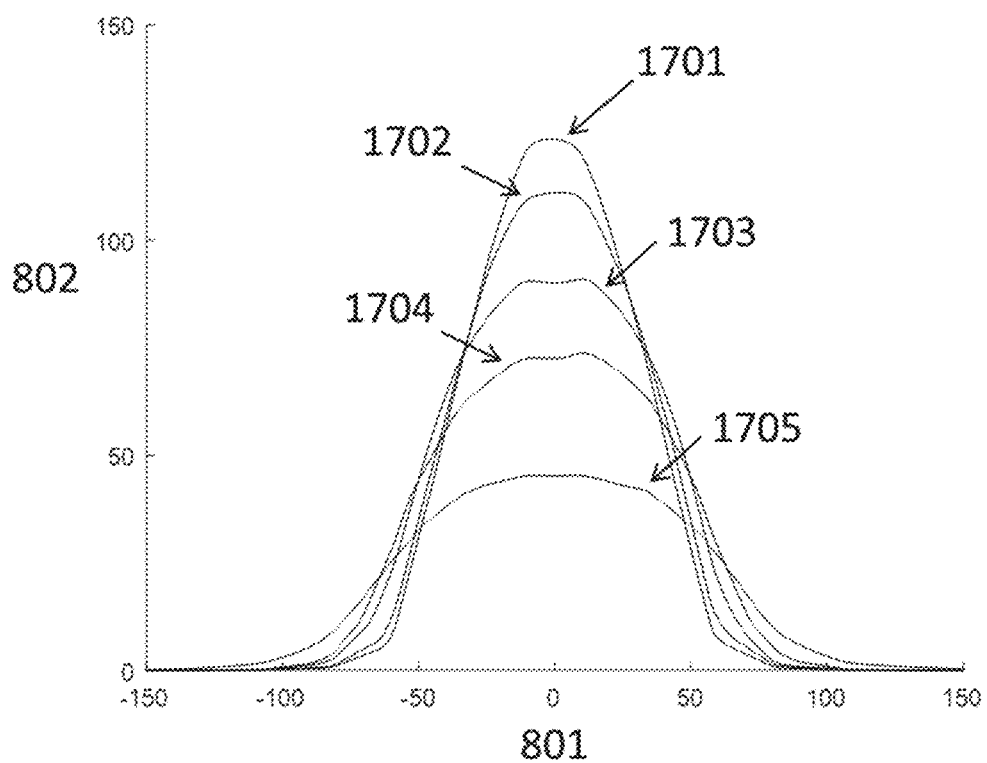
FIG. 17 shows the thickness profiles of features printed by a PDC nozzle in a single pass according to embodiments disclosed herein.

FIG. 17 shows deposition profiles for features generated by the depositor configuration shown in FIG. 16 for a range of delivery aperture separation distances A. The scale and position of the features is the same as that used in FIG. 8. A comparable feature generated by a depositor having only a single delivery aperture is shown for reference at 1701. Feature profiles for delivery aperture separations of 40 µm (1702), 80 µm (1703), 120 µm (1704), and 160 µm (1704) are shown. It has been found that a desired uniformity of 91% can be achieved for a separation distance Δ of 40 µm, with a FW5M of 154 µm.

Figure 18:
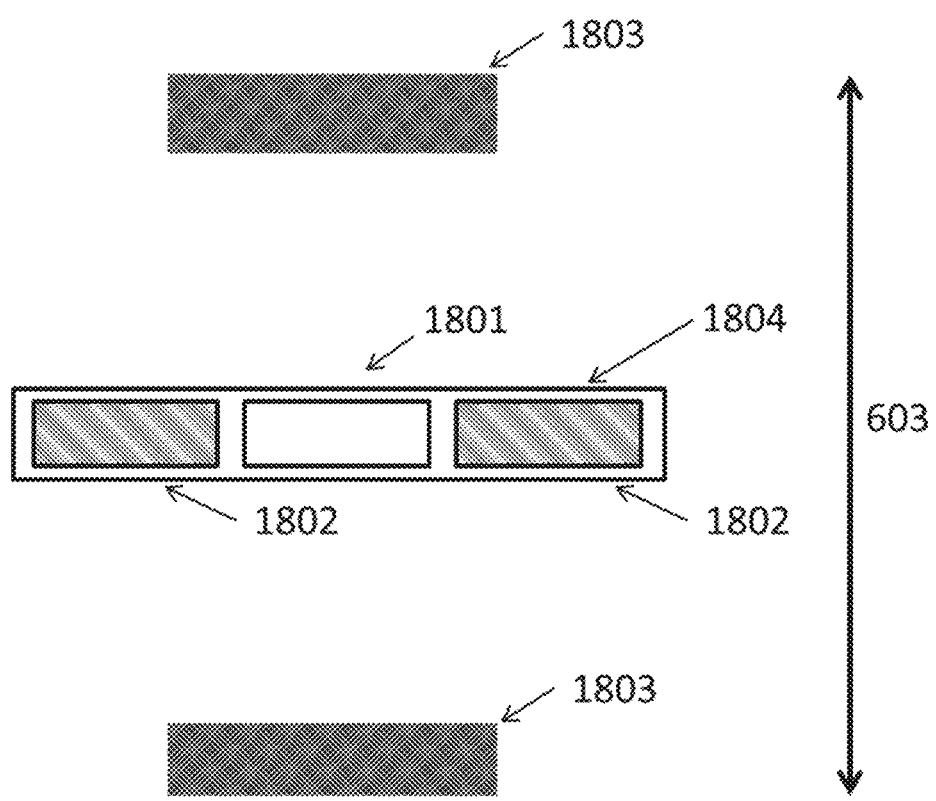
FIG. 18 shows a schematic view of an example PDC depositor configuration having rectangular delivery, confinement and exhaust apertures according to embodiments disclosed herein.

As previously disclosed, various shapes may be used for delivery, confinement, and exhaust apertures. FIG. 18 shows an embodiment in which the delivery and confinement apertures are rectangular, so as to provide a more uniform distribution of organic vapor across the width of the depositor. A round delivery aperture configuration as previously shown and described may direct most of the delivery flow towards the center of each aperture. In contrast, a rectangular slit aperture such as the delivery aperture 1801 may spread organic vapor more evenly across the desired deposition zone. Alternatively or in addition, rectangular confinement apertures 1802 also may be more effective than round apertures in some embodiments, by providing provides a more rapid transition between the delivery and confinement flows. Alternatively or in addition, rectangular exhaust apertures 1803 may be used to create uniform path lengths for streamlines of delivery gas as described with respect to FIG. 17. In some embodiment, the divider between the delivery apertures 1801 and confinement apertures 1804 may be recessed within a pocket in the depositor, so that the delivery and confinement flows enter the gap between the depositor and the substrate as a smooth stream.

Figure 19:
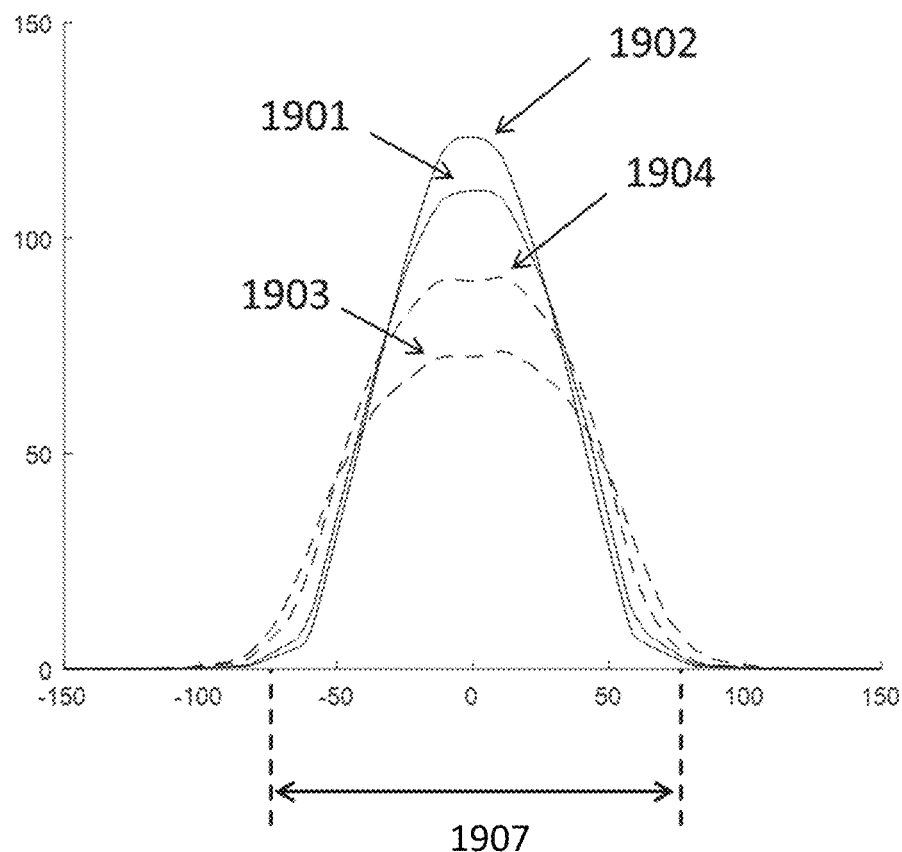
FIG. 19 shows thickness profiles of features printed by a rectangular aperture PDC depositor in a single pass according to embodiments disclosed herein.

FIG. 19 shows thickness profiles of features deposited by a square aperture depositor for the following configurations: (g=50 µm, DE=200) at 1901, (g=50 µm, DE=300) at 1902, (g=100 µm, DE=200) at 1903, and (g=100 µm, DE=300) at 1904. It was found that the optimal performance may be obtained at a fly height g of 100 µm and a DE distance of 310 µm. The feature generated by the depositor has a thickness uniformity of 93.4% and a FW5M of 150 µm (1907). It operates with a material utilization efficiency of η=0.090.

Figure 20:
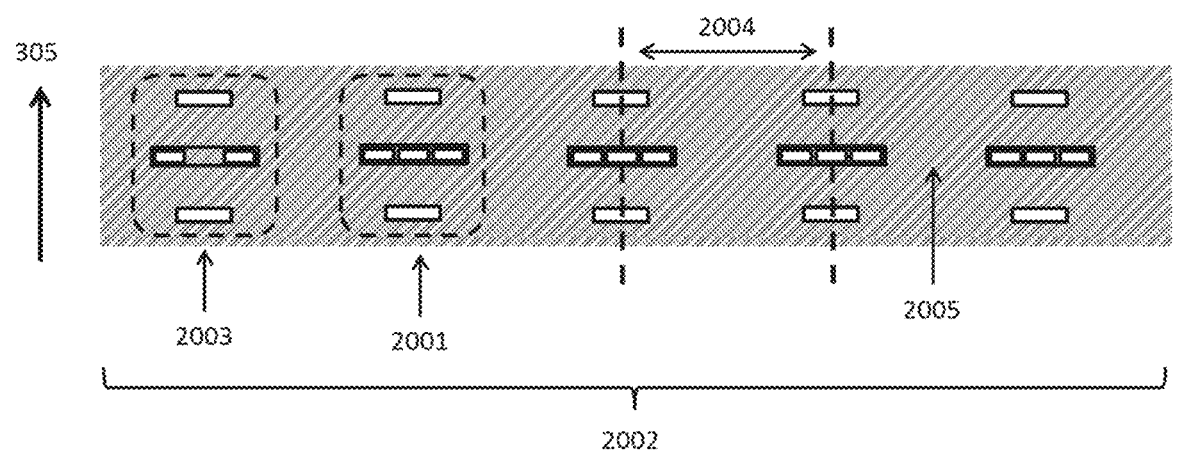
FIG. 20 shows a schematic view of an arrangement of PDC depositors in a micro-nozzle array with discrete exhaust apertures according to embodiments disclosed herein.

In some embodiments, a depositor may include multiple PDC depositor units arranged in a repeating array, so that multiple features can be deposited simultaneously. For example, FIG. 20 shows an arrangement including multiple depositor configurations 2001 as shown in FIG. 18, arranged in a linear array 2002 in a single nozzle block. The depositor face of the nozzle block is parallel to the plane of the substrate and the direction of printing is shown at 305. The configuration is analogous to that of the DEC nozzle array shown in FIG. 3. The individual depositors may be designed and positioned so as not interfere with each other, so the performance of each depositor is independent of the total array size. Periodicity of the flow field underneath the array may be assumed, though this may be less accurate near the ends of the array. In some embodiments, one or more non-depositing units 2003 having only exhaust and confinement apertures may be positioned at the ends of the array to reduce or minimize these edge effects on the depositors.

Nozzle blocks including an array of multiple depositors such as shown in FIG. 20 may be used to print an array of evenly spaced lines for applications such as the emissive layer of an RGB OLED display. It may be preferred in such applications for the depositors to be positioned with the same pitch as the desired printed line array. If this is not possible, depositors may be separated by a multiple of the line pitch at 2004 so that the line array can be printed in multiple passes. The spacing of the depositor layout also may be selected to account for the thermal expansion of the array that is expected at operating temperature for the materials being deposited. FIG. 20 shows an arrangement in which confinement apertures may provide confinement gas to a single depositor. Such an arrangement may be suited to microarray designs in which the depositors are spaced at a relatively wide pitch relative to the size of the features they print. The array may include regions for which no confinement flow is needed or desired, such as the separation space 2005 between depositors, so the gas flow in these regions may remain stagnant. However, it may be desirable for both sides of the delivery flow lane to be sheathed in confinement flow.

Figure 21:
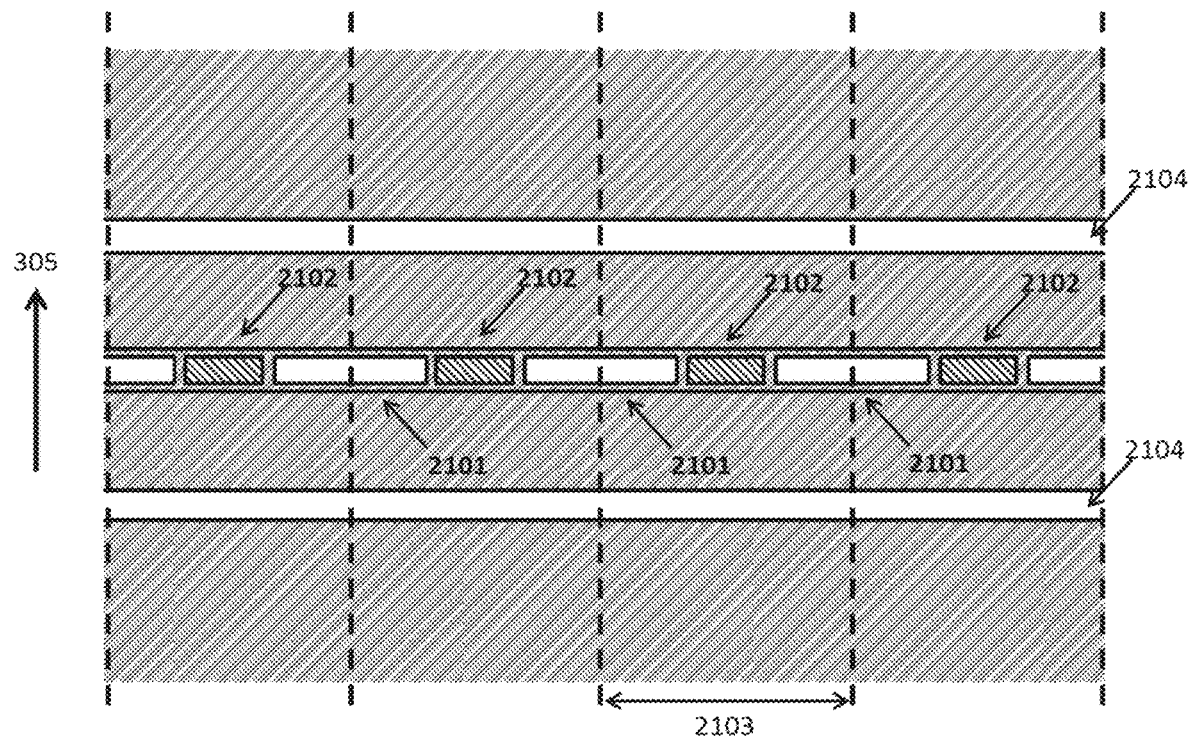
FIG. 21 shows schematic view of an arrangement of PDC depositors in a micro-nozzle array with exhaust apertures that are continuous between depositors according to embodiments disclosed herein.

Alternatively, a single confinement aperture may be used to provide a confinement flow to multiple depositor arrangements. FIG. 21 shows a nozzle block in which a confinement aperture 2101 may provide confinement gas to two adjacent depositors 2102. This configuration may be useful for microarray designs in which the feature size is relatively wide relative to the depositor pitch 2103. It may reduce the complexity of the nozzle block by minimizing the number of apertures, while permitting depositors to be more closely spaced. The width of the confinement flow is roughly the same as that of the delivery flow, so there no benefit to separating the confinement flow apertures of adjacent depositors if the desired FWSM of the printed feature is greater than 30% of the depositor pitch.

For example, if an array of lines having a FWSM of 120 μm and a pitch of 320 μm is desired, a depositor array having a pitch of 320 μm or a multiple thereof may be used. A depositor array with a pitch of 320 μm can print the lines in a single pass. Such a device may be designed, for example, so that each confinement aperture provides confinement gas to two adjacent depositors. As another example, a depositor array with a pitch of 960 μm would require three passes to print the lines, and likely would be configured so that each confinement aperture provides confinement gas to only one depositor.

The exhaust apertures 2104 in shown in FIG. 21 may be a continuous slit stretching extending adjacent depositors. This simplifies both the design and fabrication of the nozzle array. While the divider between delivery and confinement apertures perturbs flow somewhat, there is minimal variation in the inlet and outlet conditions of the flow field in the x direction. If the delivery and confinement gas streams have comparable viscosities, they are defined by differences in composition only and flow field effectively becomes two dimensional. Such a design may be advantageous, for example, for use with an array of densely packed depositors where simplicity of the individual units is desired. It may be disadvantageous in comparison to an array of discrete exhaust apertures, because variation in the flow field along the x axis may be used to counteract diffusive spreading of the vapor in the delivery flow close to the exhaust, as disclosed with respect FIG. 8.

Figure 22B:
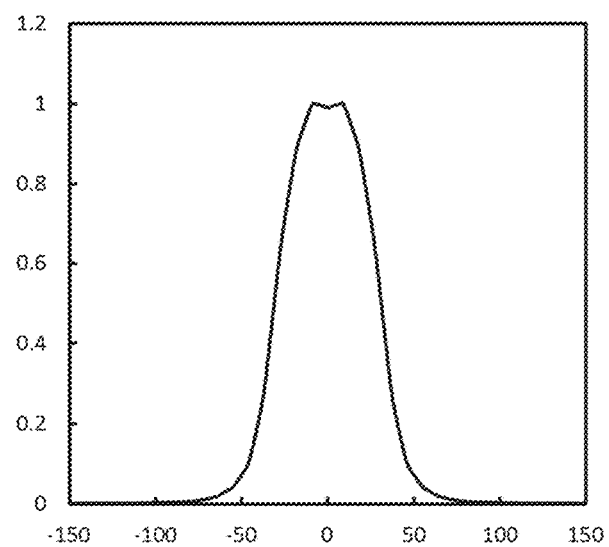
FIG. 22B shows a feature profile of a feature printed by a PDC depositor having a configuration as shown in FIG. 21 according to embodiments disclosed herein.
Figure 22A:
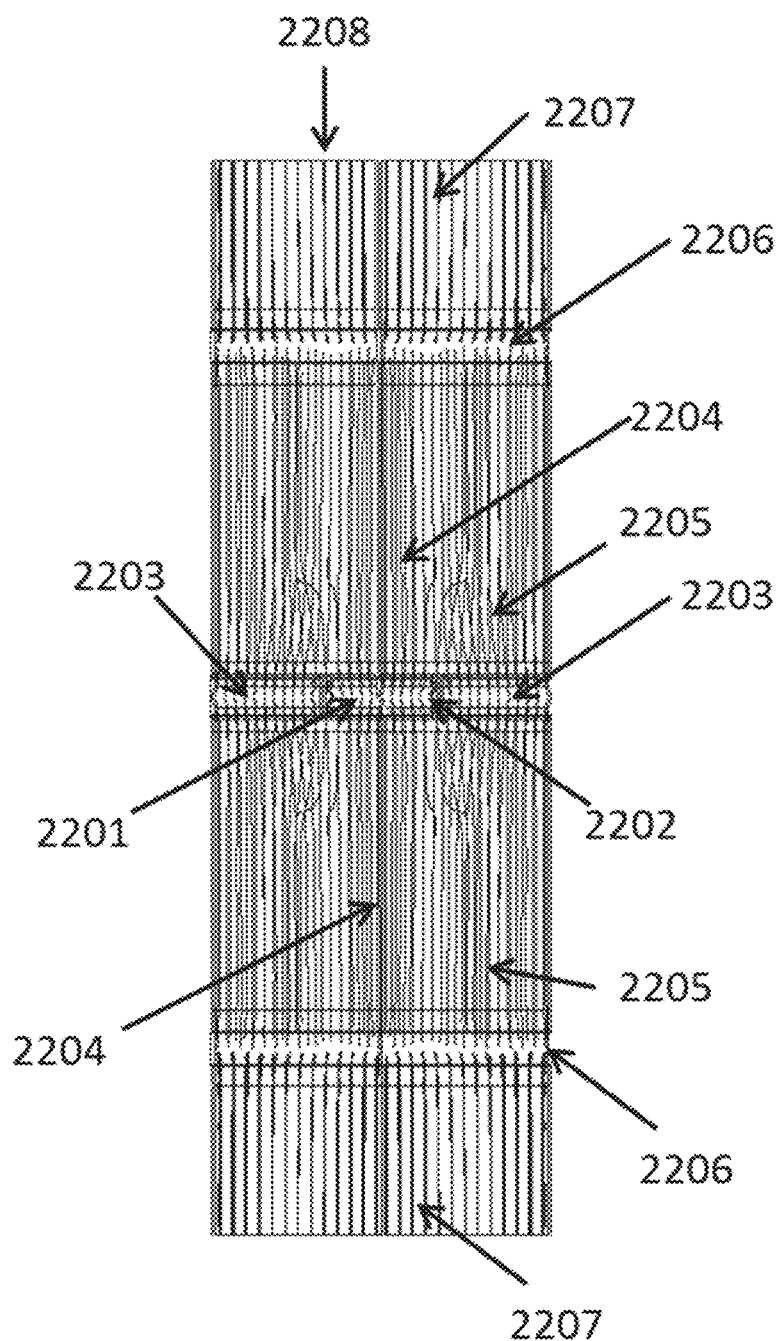
FIG. 22A shows patterns of flow generated by a PDC depositor having a configuration as shown in FIG. 21 according to embodiments disclosed herein.

FIG. 22A shows streamlines of gas flow generated by a depositor configuration as shown in FIG. 21. In this example, the delivery aperture 2201 is 100 μm in width and separated from the neighboring confinement aperture by a 10 μm septum 2202. The confinement aperture 2203 between delivery apertures is 207 μm in width, for a depositor pitch of 317 μm. The delivery flow rate 2204 is 4 sccm per depositor and the confinement flow rate 2205 is 8.3 sccm per depositor. These flow rates may be chosen, for example, so that the flow from the midline of the depositor to the exhaust 2206 is constant across its width. Flow through the exhaust may be approximately twice the combined delivery and confinement flow. The difference is made up by a secondary confinement flow 2207 sourced from the gas ambient around the array that flows from the edge of the depositor face 2208 to the exhaust.

The deposition profile for a feature printed with this depositor arrangement is shown in FIG. 22B, using the same scale and position as used in FIG. 8, with the vertical axis being normalized to the maximum thickness of the printed feature. As shown, it was found that the feature has a FWSM of 107 μm, a uniformity of 69% and a material utilization efficiency of 5.8% at a fly height g of 100 μm. If the feature is deposited in two passes by depositors offset by 60 μm, a uniformity of 96% can be achieved.

PDC depositors as disclosed herein may be particularly suited for OVJP printing of intermediate-size features. Such features are still sub-millimeter scale individually, but may not require side wall heights in the 25-50 μm range. At this scale, the transition between adjacent features may be less important than the overall efficiency of deposition. For example, PDC depositors and techniques as disclosed herein may be particularly suited for features not larger than about 250-300 μm, i.e., features having a largest main-axis dimension in a direction across and parallel to the substrate of not more than about 250-300 μm.

As previously disclosed, various dimensions may be selected and used for PDC depositor components and nozzle blocks as disclosed herein, depending upon the feature size and resolution desired. In general, it may be desirable for the exhaust aperture(s) to be wider than the delivery aperture(s), at least in part to result in the total mass flow of material being removed via the exhaust apertures is greater than the total being provided through the delivery apertures. That is, it may be desirable for the molar flow of inert gas removed through the exhaust aperture(s) in a PDC depositor or nozzle block to be greater than the total molar flow of inert gas provided by the delivery aperture(s) in the depositor or nozzle block, as previously disclosed. It also may be desirable for the exhaust aperture(s) to have a maximum width as previously defined herein of not more than a desired feature size. For example, the maximum width of exhaust aperture(s) in a PDC depositor or nozzle block as disclosed herein may be 100, 200, 300, 400, or 500 μm or, more generally, any width in the range of about 100-500 μm.

Figure 23:
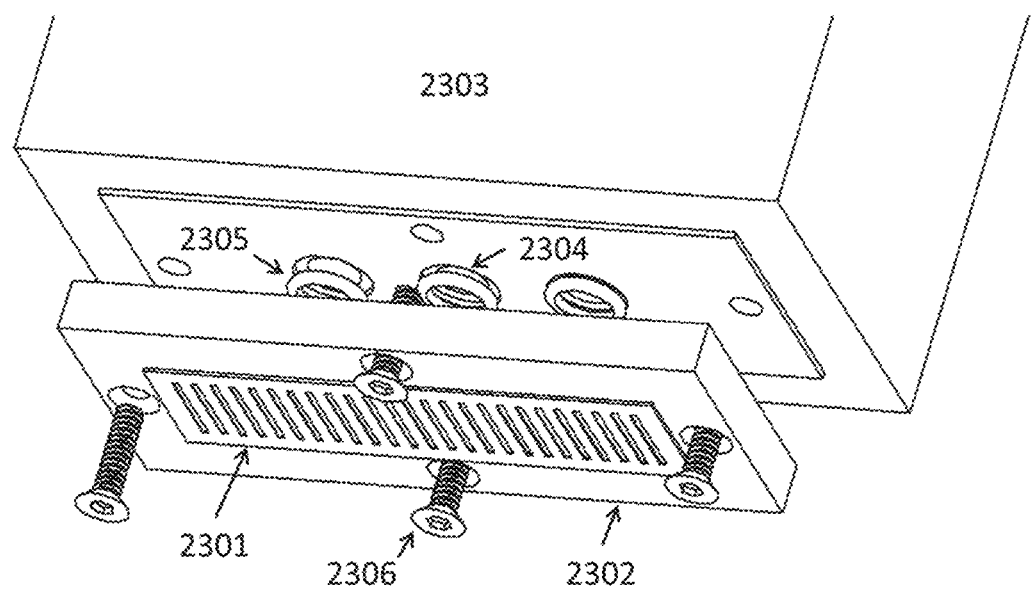
FIG. 23 shows an example of a micro-nozzle array having PDC depositors according to embodiments disclosed herein, which are affixed to a backing plate and an injection block.

PDC depositors as disclosed herein may be physically realized by etching a silicon membrane with the desired configuration of delivery, confinement, and exhaust apertures using standard MEMs processing techniques. FIG. 23 shows an example of such a nozzle array 2301 as disclosed herein, made from a silicon membrane. Techniques such as deep reactive ion etching or KOH wet etching can be used to produce through-wafer apertures with the desired sidewall profile. Multiple layers of Si can be added behind the membrane provide routing channels to for the apertures. These layers can be attached to the membrane using processes like fusion bonding. The membrane itself can be the device layer of a silicon on oxide (SOI) wafer, supported by a handle layer that is removed by a dissolved wafer process when no longer needed. The membrane may be brazed onto a polished metal backing plate 2302 fabricated from Kovar or other material with similar thermal expansion properties to Si. An example of this process is described in U.S. Pat. No. 8,944,309, the disclosure of which is incorporated by reference in its entirety. The backing plate may be connected to a heated injection block 2303 containing sublimation sources and a network of channels providing fluid flow to and from the micronozzle array, similar to DEC depositors as previously disclosed. The injection block may have one or more ports 2304 connecting these channels to the backing plate. The ports and/or their mates on the reverse of the backing plate may be surrounded by glands required for either metal or high temperature elastomer gaskets 2305. The compression for these gaskets is supplied by bolts 2306 that hold the backing plate to the injection block.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) depositor, comprising:
   a print head configured to move along a first direction of motion relative to a substrate disposed below the print head, the print head further comprising:
      a delivery aperture in fluid communication with a source of organic material to be deposited on a substrate and a carrier gas;
      a first exhaust aperture disposed ahead of and aligned with the delivery aperture along the first direction of motion;
      a second exhaust aperture disposed behind and aligned with the delivery aperture along the first direction of motion;
      a first confinement gas aperture disposed laterally adjacent to the delivery aperture relative to the first direction of motion; and
      a second confinement gas aperture disposed laterally adjacent to the delivery aperture and opposite the first confinement gas aperture relative to the first confinement gas aperture.

2. The depositor of claim 1, wherein the delivery aperture, the first and second exhaust apertures, and the first and second confinement gas apertures are arranged on a surface of the depositor such that, when the depositor is operated to deposit organic material on a substrate, a first flow of material from the delivery aperture to at least one of the first and second exhaust apertures is parallel to a second flow of material from at least one of the first and second confinement gas apertures.

3. The depositor of claim 1, wherein a dimension of the delivery aperture parallel to a direction of relative motion of the depositor and a substrate when the depositor is operated to deposit material on the substrate is shorter than a distance between an edge of the delivery aperture closest to the second exhaust aperture and an edge of the second exhaust aperture farthest from the delivery aperture.

4. The depositor of claim 1, wherein the first exhaust aperture has a width that is less than a width of a feature to be printed on a substrate when the depositor is operated to deposit material on the substrate.

5. The depositor of claim 1, wherein the first exhaust aperture has a width of not more than 50 μm.

6. The depositor of claim 1, wherein the first exhaust aperture and the second exhaust aperture are oval or circular.

7. The depositor of claim 1, wherein the first exhaust aperture and the second exhaust aperture are rectangular.

8. The depositor of claim 7, wherein the first and second confinement gas apertures are rectangular.

9. The depositor of claim 7, wherein the delivery aperture is rectangular.

10. The depositor of claim 1, wherein the delivery aperture has chamfered side walls.

11. The depositor of claim 10, wherein the first and second confinement apertures have chamfered side walls.

12. The depositor of claim 1, wherein the delivery-to-exhaust spacing DE of the depositor is not more than 400 μm.

13. The depositor of claim 1, wherein the delivery-to-confinement spacing DC of the depositor is not more than 130 μm.

14. The depositor of claim 1, wherein the width of the first and second exhaust apertures is greater than the width of the delivery aperture.

15. The depositor of claim 1, wherein, when operated to deposit material on a substrate, the molar flow of inert gas through the first and second exhaust apertures in total is greater than the molar flow of inert gas through the delivery aperture.

16. The depositor of claim 1, wherein each of the first and second exhaust apertures has a maximum width of not more than 500 μm.

17. The depositor of claim 16, wherein each of the first and second exhaust apertures has a maximum width in the range of 100-500 μm.

18. An OVJP nozzle block comprising a plurality of depositors as recited in claim 1 arranged in a linear array.

* * * * *